United States Patent
Male

(10) Patent No.: US 10,411,150 B2
(45) Date of Patent: Sep. 10, 2019

(54) OPTICAL ISOLATION SYSTEMS AND CIRCUITS AND PHOTON DETECTORS WITH EXTENDED LATERAL P-N JUNCTIONS

(71) Applicant: Texas Instruments Incorporated, Dallas, TX (US)

(72) Inventor: Barry Jon Male, West Granby, CT (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 15/612,327

(22) Filed: Jun. 2, 2017

(65) Prior Publication Data

US 2018/0190855 A1    Jul. 5, 2018

Related U.S. Application Data

(63) Continuation-in-part of application No. 15/395,584, filed on Dec. 30, 2016, now Pat. No. 10,074,639.

(51) Int. Cl.
*H01L 31/167*    (2006.01)
*H01L 31/0352*    (2006.01)
(Continued)

(52) U.S. Cl.
CPC ...... *H01L 31/167* (2013.01); *H01L 23/49541* (2013.01); *H01L 23/49575* (2013.01);
(Continued)

(58) Field of Classification Search
CPC ....... H01L 31/035263; H01L 31/03529; H01L 31/035272; H01L 25/167; H01L 31/167–173; H04B 10/802
See application file for complete search history.

(56) References Cited

U.S. PATENT DOCUMENTS 3,508,126 A  *  4/1970  Beer ................. H01L 21/02546
                                                          136/255
3,952,265 A  *  4/1976  Hunsperger ......... G02B 6/4212
                                                         372/50.21
(Continued)

FOREIGN PATENT DOCUMENTS

EP    1986297 A2    10/2008
EP    2490263 A2     8/2012
(Continued)

OTHER PUBLICATIONS

Notification of Transmittal of the International Search Report and the Written Opinion of the International Searching Authority, or the Declaration; dated May 17, 2018, 8 pages.

(Continued)

*Primary Examiner* — Daniel Luke
(74) *Attorney, Agent, or Firm* — Tuenlap Chan; Charles A. Brill; Frank D. Cimino

(57) ABSTRACT

Disclosed examples include lateral photovoltaic sensors and systems with one or more semiconductor structures individually including a lateral sensor face to receive photons of a given wavelength, and an extended lateral junction region having an effective junction distance greater than 5 times an absorption depth for the semiconductor structure that corresponds to the given wavelength, to facilitate high current transfer ratios for use in low-noise, high-efficiency power supply applications as well as optically isolated data transfer or photon detector applications.

19 Claims, 18 Drawing Sheets

(51) Int. Cl.
  *H04B 10/80* (2013.01)
  *H01L 23/495* (2006.01)
  *H01L 25/16* (2006.01)
  *H01L 31/02* (2006.01)
  *H01L 33/62* (2010.01)
  *H01L 31/0203* (2014.01)
  *H01L 33/60* (2010.01)

(52) U.S. Cl.
  CPC .......... *H01L 25/165* (2013.01); *H01L 25/167* (2013.01); *H01L 31/0203* (2013.01); *H01L 31/02005* (2013.01); *H01L 31/03529* (2013.01); *H01L 33/62* (2013.01); *H04B 10/802* (2013.01); *H01L 33/60* (2013.01); *H01L 2224/32245* (2013.01); *H01L 2224/48091* (2013.01); *H01L 2224/48137* (2013.01); *H01L 2224/48145* (2013.01); *H01L 2224/48247* (2013.01); *H01L 2224/48257* (2013.01); *H01L 2224/73265* (2013.01); *H01L 2924/181* (2013.01)

(56) References Cited

U.S. PATENT DOCUMENTS

| | | | |
|---|---|---|---|
| 4,007,978 | A | 2/1977 | Holton |
| 4,267,484 | A | 5/1981 | O'Loughlin |
| 4,272,753 | A | 6/1981 | Nicolay |
| 4,891,730 | A | 1/1990 | Saddow et al. |
| 4,916,506 | A | 4/1990 | Gagnon |
| 4,996,577 | A | 2/1991 | Kinzer |
| 5,340,993 | A | 8/1994 | Salina et al. |
| 5,389,578 | A | 2/1995 | Hodson et al. |
| 5,514,892 | A | 5/1996 | Countryman et al. |
| 5,629,838 | A | 5/1997 | Knight |
| 5,796,570 | A | 8/1998 | Mekdhanasarn et al. |
| 5,929,514 | A | 7/1999 | Yalamanchili |
| 5,990,519 | A | 11/1999 | Huang-Lu et al. |
| 6,031,251 | A | 2/2000 | Gempe et al. |
| 6,242,987 | B1 | 6/2001 | Schopf et al. |
| 6,351,011 | B1 | 2/2002 | Whitney et al. |
| 6,365,433 | B1 | 4/2002 | Hyoudo et al. |
| 6,507,264 | B1 | 1/2003 | Whitney |
| 6,509,574 | B2 | 1/2003 | Yuan et al. |
| 6,815,808 | B2 | 11/2004 | Hyodo et al. |
| 6,821,822 | B1 | 11/2004 | Sato |
| 6,977,468 | B1 | 12/2005 | Baginski |
| 7,015,587 | B1 | 3/2006 | Poddar |
| 7,321,162 | B1 | 1/2008 | Lee et al. |
| 7,732,892 | B2 | 6/2010 | Jeng et al. |
| 7,842,542 | B2 | 11/2010 | Shim et al. |
| 7,869,180 | B2 | 1/2011 | Cheung et al. |
| 8,018,705 | B2 | 9/2011 | Michalopoulos et al. |
| 8,433,084 | B2 | 4/2013 | Conti et al. |
| 8,436,460 | B1 | 5/2013 | Gamboa et al. |
| 8,569,082 | B2 | 10/2013 | Kummerl et al. |
| 8,633,551 | B1 | 1/2014 | Teh et al. |
| 9,184,012 | B2 | 11/2015 | Wang |
| 9,419,075 | B1 | 8/2016 | Carothers et al. |
| 9,748,207 | B2 | 8/2017 | Krause et al. |
| 9,929,110 | B1 | 3/2018 | Male et al. |
| 2003/0183916 | A1 | 10/2003 | Heck et al. |
| 2003/0222205 | A1* | 12/2003 | Shoji ............ H01L 25/167 250/214 R |
| 2004/0084729 | A1 | 5/2004 | Leung et al. |
| 2004/0111881 | A1 | 6/2004 | Yang et al. |
| 2005/0218300 | A1 | 10/2005 | Quinones et al. |
| 2006/0205106 | A1 | 9/2006 | Fukuda et al. |
| 2006/0281334 | A1 | 12/2006 | Shin et al. |
| 2007/0076421 | A1 | 4/2007 | Kogo et al. |
| 2007/0152308 | A1 | 7/2007 | Ha et al. |
| 2007/0229177 | A1 | 10/2007 | Moriya |
| 2008/0217759 | A1 | 9/2008 | Lin et al. |
| 2008/0266730 | A1 | 10/2008 | Viborg et al. |
| 2008/0290486 | A1 | 11/2008 | Chen et al. |
| 2009/0052214 | A1 | 2/2009 | Edo et al. |
| 2009/0115049 | A1 | 5/2009 | Shiraishi et al. |
| 2009/0127638 | A1 | 5/2009 | Kilger et al. |
| 2010/0187652 | A1 | 7/2010 | Yang |
| 2010/0244234 | A1 | 9/2010 | Sonobe et al. |
| 2010/0252923 | A1 | 10/2010 | Watanabe et al. |
| 2011/0089540 | A1 | 4/2011 | Drost et al. |
| 2011/0108747 | A1 | 5/2011 | Liu |
| 2011/0233790 | A1 | 9/2011 | Bchir |
| 2013/0134445 | A1 | 5/2013 | Tarsa et al. |
| 2013/0194057 | A1 | 8/2013 | Ruby |
| 2013/0315533 | A1 | 11/2013 | Tay et al. |
| 2013/0320548 | A1 | 12/2013 | Carpenter et al. |
| 2013/0329324 | A1 | 12/2013 | Tziviskos et al. |
| 2014/0001632 | A1 | 1/2014 | Uehling et al. |
| 2014/0264905 | A1 | 9/2014 | Lee et al. |
| 2015/0035091 | A1 | 2/2015 | Ziglioli |
| 2015/0069537 | A1 | 3/2015 | Lo et al. |
| 2015/0249043 | A1 | 9/2015 | Elian et al. |
| 2015/0255693 | A1 | 9/2015 | Baade et al. |
| 2015/0369681 | A1 | 12/2015 | Imai et al. |
| 2015/0369682 | A1 | 12/2015 | Nakajima |
| 2015/0380353 | A1 | 12/2015 | Bauer et al. |
| 2016/0003436 | A1 | 1/2016 | Singer et al. |
| 2016/0064696 | A1 | 3/2016 | Collier et al. |
| 2016/0103082 | A1 | 4/2016 | Kimura |
| 2016/0167089 | A1 | 6/2016 | Ng et al. |
| 2016/0209285 | A1 | 7/2016 | Nakajima |
| 2017/0089789 | A1 | 3/2017 | Kanemoto |
| 2017/0134004 | A1 | 3/2017 | Isozaki et al. |
| 2017/0330841 | A1 | 11/2017 | Cook et al. |

FOREIGN PATENT DOCUMENTS

| | | |
|---|---|---|
| GB | 2521619 A | 7/2015 |
| RU | 2201017 C2 | 3/2003 |
| RU | 2263999 C1 | 11/2005 |
| RU | 2169962 C2 | 6/2011 |

OTHER PUBLICATIONS

Cameron G. Clark, "The Basics of Arc Flash," GE Industrial Solutions web site accessed Oct. 5, 2016, http://apps.geindustrial. corn/publibrary/checkout/ArcFlash4?TNR=White%20Papers% 7CArcFlash4%7Cgeneric (3 pages).

National Semiconductor Corporation, "Semiconductor Packaging Assembly Technology," National Semiconductor Corporation, Aug. 1999, pp. 1-8.

Cook, et al.: "Floating Die Package"; U.S. Appl. No. 15/248,151, filed Aug. 26, 2016; 34 pages.

Maloberti, F., "Layout of Analog CMOS Integrated Circuit, Part 2 Transistors and Basic Cells Layout," retrieved from http://ims.unipv. it/Courses/download/AIC/Layout02.pdf, dated Mar. 15, 2004 (38 pages).

Texas Instruments Product Brochure ISO7841x High-Performance, 8000-Vpk Reinforced Quad-Channel Digital Isolator, dated Nov. 2014 (37 pages).

Texas Instruments Application Report "The ISO72x Family of High-Speed Digital Isolators," SLLA198—Jan. 2006 (12 pages).

Texas Instruments Developers Guide "Digital Isolator Design Guide," SLLA284A, Jan. 2009 (19 pages).

Wikipedia article "3D Printing," retrieved from "http://en.wikipedia. org/w/index.php?title=3D_printing&oldid=624190184", dated Sep. 4, 2014 (35 pages).

OSRAM Opto Semiconductors GmbH, Olson Compact (850nm), version 1.6, SFH 4710, dated Dec. 1, 2015, 13pp.

Notification of Transmittal of the International Search Report and the Written Opinion of the International Searching Authority, or the Declaration; dated May 24, 2018, 8 pages.

U.S. Appl. No. 15/248,151, filed Aug. 26, 2016 (34 pages).

International Search Report for PCT/US2017/031987 dated Sep. 7, 2017.

(56) References Cited

OTHER PUBLICATIONS

Search Report for European Patent Application No. 17796774.2, dated Apr. 26, 2019, 2 pages.

\* cited by examiner

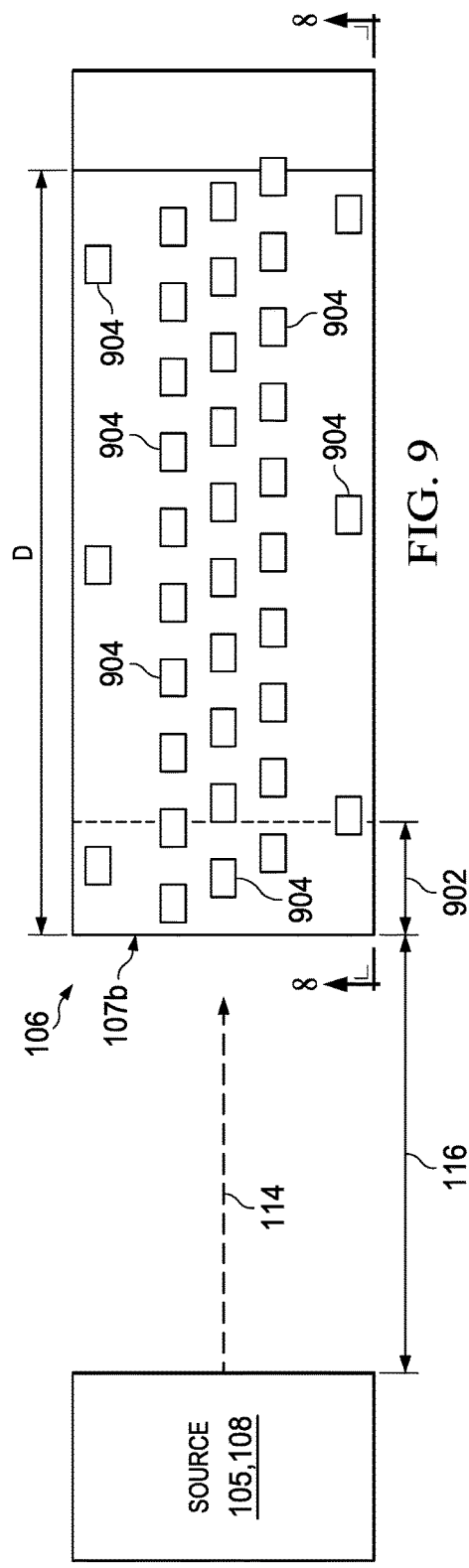
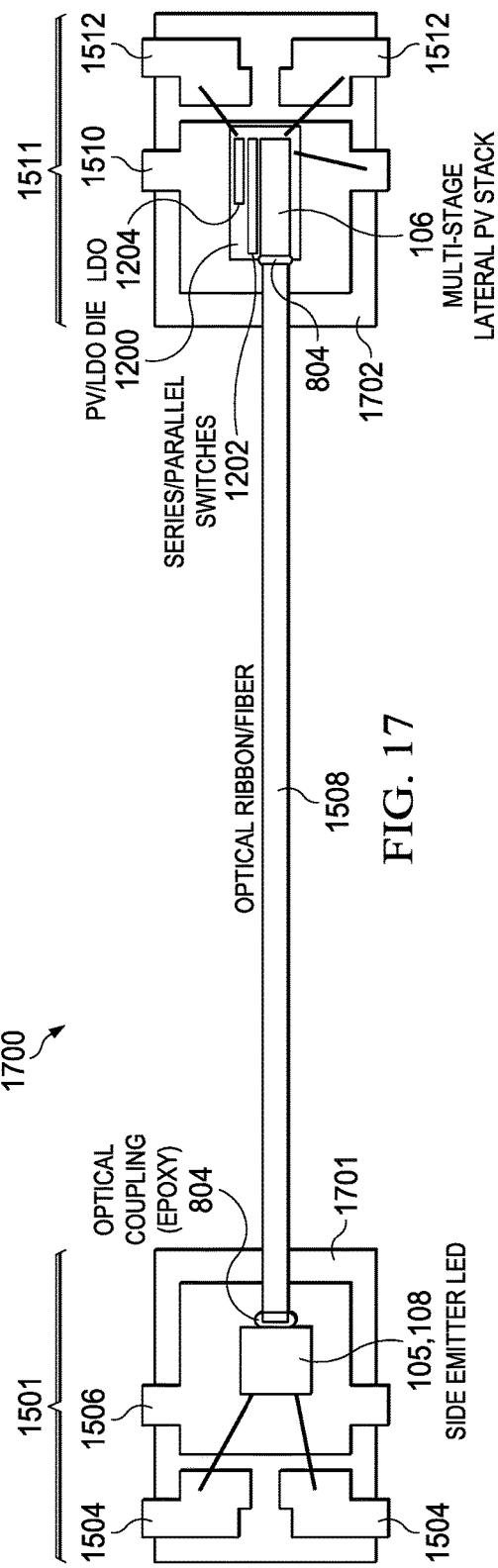

OPTICAL ISOLATION SYSTEMS AND CIRCUITS AND PHOTON DETECTORS WITH EXTENDED LATERAL P-N JUNCTIONS

REFERENCE TO RELATED APPLICATION

This application is a continuation in part of, and claims priority to and the benefit of, U.S. patent application Ser. No. 15/395,584, filed on Dec. 30, 2016, entitled ISOLATOR INTEGRATED CIRCUITS WITH PACKAGE STRUCTURE CAVITY AND FABRICATION METHODS, the entirety of which is hereby incorporated by reference.

BACKGROUND

Isolation circuits are for data and/or power transfer across a galvanic isolation barrier to interconnect electrical systems powered by different supply sources that do not share a common ground connection. Transformer isolation approaches involve switching circuits and magnetic fields, and the resulting electromagnetic interference (EMI) may be undesirable in certain applications. In addition, transformer isolation typically requires an additional transformer component and these solutions require significant circuit area and are costly. Capacitive coupling or AC coupling can be used to provide isolation for data transmission, but capacitor-based isolation solutions often involve parasitic capacitance that absorbs signal energy and leads to poor power efficiency. In addition, high voltage breakdown voltage ratings are costly to implement using capacitive coupling due to the need for thick layers of surface dielectric. Optical isolation avoids the EMI and circuit area problems associated with transformer isolation by transferring electrical power/signals between galvanically isolated circuits using light via a photon emitter (e.g., a light-emitting diode or LED), a receiver or sensor such as a Photo-Voltaic diode (PVD) and an optical coupling material. Optical coupling devices or optocouplers typically stack an LED source above a PV diode with glass or other transparent material in between to transmit photon energy vertically downward to the top of the PVD sensor. Moreover, high breakdown voltage isolation ratings can be achieved only by increasing the distance between the LED and the PVD, resulting in sometimes unacceptable vertical device heights. Some high isolation voltage optocouplers use a reflective dome that reflects light from the LED to the photodiode, which are positioned side-by-side for upward transmission by the LED and downward reception by the photodiode. In these conventional optocoupler approaches, the photon path is perpendicular to the surface of the silicon devices. LED light sources typically provide light signals at or near infrared wavelengths, and optocouplers generally suffer from poor power efficiency (e.g., current transfer ratio or CTR representing the ratio of the input current to the output current). In addition Common Mode Transient Isolation (CMTI) suffers in vertical constructions due to the capacitive coupling between emitter and detector. Accordingly, conventional optical isolation techniques do not provide adequate solutions for many power transfer applications.

SUMMARY

Disclosed examples include lateral photovoltaic sensors and systems, as well as optical isolation circuits with semiconductor structures that include a lateral sensor face to receive photons of a given wavelength, and an extended lateral junction region having an effective junction distance in excess of the absorption depth for the semiconductor material that corresponds to the given wavelength to facilitate high efficiency for data and/or power transmission across a galvanic isolation barrier. In certain examples, a lateral extended p-n junction is formed by multiple diffused or implanted n-doped regions in a p-doped region to form a series of p-n junctions disposed throughout the lateral effective junction distance. The extended unitary or segmented p-n junction provides significantly increased photon capture probability compared with vertical photodiode structures to facilitate high efficiency and current transfer ratios in a variety of applications. Further disclosed examples for optical isolation of high-speed signal information include optical sensor circuits to sense a light signal of a given wavelength along a lateral optical path using a lateral extended p-n junction array with a biased quench circuit to bias the junction near avalanche. In this application the capture of a single photon causes the p-n junction to conduct an avalanche of current resulting in direct amplification.

BRIEF DESCRIPTION OF THE DRAWINGS

FIG. 9 is a partial schematic optical isolation system including a top plan view of an example of a lateral extended junction photodiode semiconductor structure with example output current taps.

FIG. 17 is a partial schematic sectional top plan view of an optical isolation system including a light source IC and LMSPV light sensor coupled by an optical fiber.

DETAILED DESCRIPTION

Figure 1:
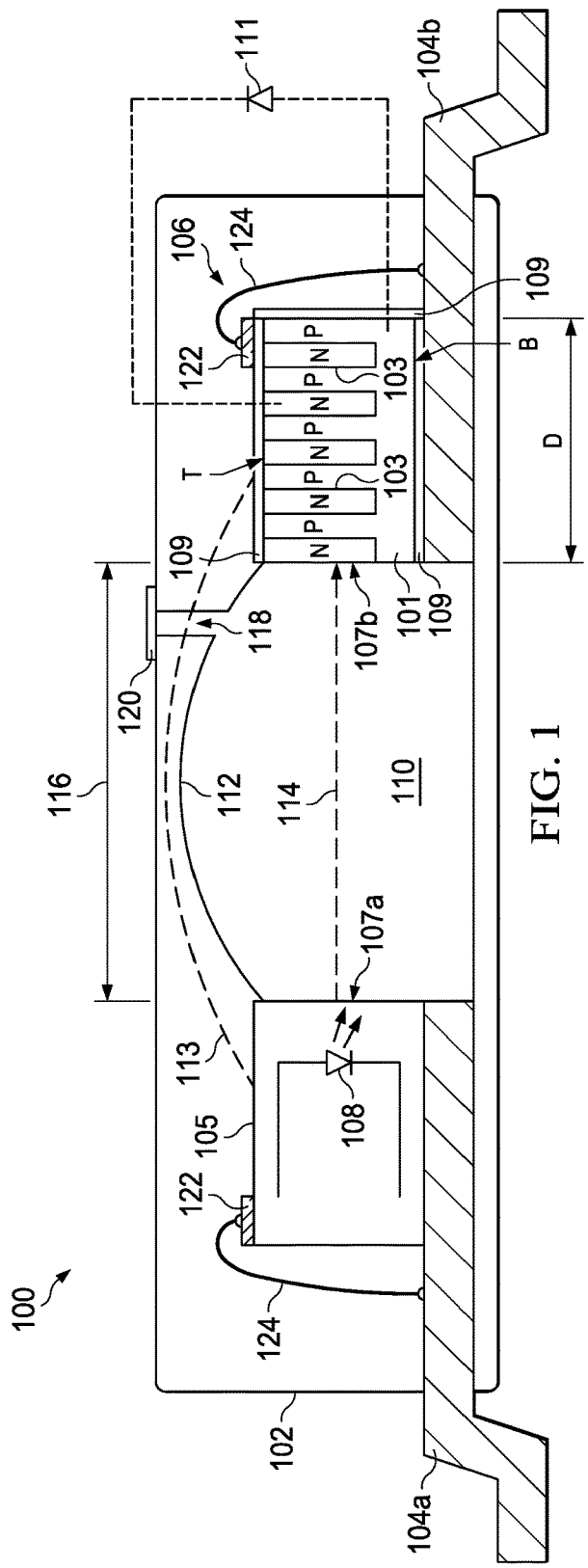
FIG. 1 is a sectional side elevation view of an optical isolation integrated circuit including an LED light source and a lateral photo receptor diode sensor with a semiconductor structure having a plurality of laterally spaced p-n junctions throughout an extended effective junction distance in an internal cavity of a molded package structure providing an optical path for electrical isolation according to an embodiment.

In the drawings, like reference numerals refer to like elements throughout, and the various features are not necessarily drawn to scale. In the following discussion and in the claims, the terms "including", "includes", "having", "has", "with", or variants thereof are intended to be inclusive in a manner similar to the term "comprising", and thus should be interpreted to mean "including, but not limited to . . . " Also, the terms "couple", "coupled" or "couples" is intended to include indirect or direct electrical or mechanical connection or combinations thereof. For example, if a first device couples to or is coupled with a second device, that connection may be through a direct electrical connection, or through an indirect electrical connection via one or more intervening devices and connections.

Referring initially to FIG. 1, lateral photovoltaic sensors and systems are disclosed with one or more semiconductor structures that include a lateral sensor face to receive photons from a light source. The semiconductor structures include an extended lateral junction region with an effective junction distance greater than an absorption depth for the semiconductor material that corresponds to the wavelength of the received light signal. Various embodiments provide optical isolation devices and systems including a light source and such a lateral light sensor with a spacing distance between the light source and the light receiver to establish a high level of breakdown or isolation voltage rating of the device. In addition, the extended effective junction distance facilitates high current transfer ratios between the source current in the electrical current generated by the light sensor, and provides a solution for higher-efficiency power transfer through a galvanic isolation barrier. Various examples include sensor circuits with optical boundaries around the sensor channel to mitigate cross talk and enable internal reflections for high-efficiency transfer of power and/or data signals between the source and the sensor. Multichannel data transmission implementations are possible, as well as single or multichannel power transfer embodiments. Disclosed examples can also be used for photon sensors, such as photon multipliers and other detector circuits. In various examples, the extended lateral length of the p-n junction facilitates high photon capture probabilities to achieve high efficiency. Certain examples include a single extended p-n junction in the semiconductor structure. Other examples provide multiple p-n junctions laterally disposed across an extended effective junction distance. In certain examples, moreover, multiple extended junction semiconductor structures are interconnected to form a lateral multistage photovoltaic (LMSPV) light sensor to provide a variety of different output currents and/or voltages for power transfer applications. The LMSPV structures can also be used for data transfer applications. The disclosed examples advantageously facilitate the use of optical isolation to avoid or mitigate the above described shortcomings of magnetic and capacitive isolation techniques and apparatus for power and/or data transfer, while facilitating higher efficiency than was possible with previous optocouplers and optical isolation devices. In certain implementations, bias and quench circuits are combined with the extended junction semiconductor structures to form a photon detector with integrated amplification or as is commonly referred to as a silicon photon multiplier (SiPM) device.

FIG. 1 shows an optical isolation integrated circuit (IC) 100 including a molded structure 102 with one or more electrical conductor structures 104 to form an integrated circuit package that includes an LED light source 108 and a lateral light sensor 106. A light signal travels through a cavity 110 of an integrated circuit package structure 102 along an optical path 114 from a lateral signal output face 107a of the light source 108 to a lateral sensor face 107b of the light sensor 106. In one example, the light source 108 is an LED fabricated in a first GaAs semiconductor die or other circuit structure 105, although lasers, silicon based photon emitters or other optical sources can be used in other embodiments. The sensor 106 includes a semiconductor structure formed by a p-doped region 101 and one or more n-doped regions 103 to form a plurality of laterally spaced p-n junctions throughout an extended effective junction distance D. In illustrated examples, the light sensor 106 is fabricated as a second device or circuit structure with a vertical front side forming the lateral sensor face 107b that faces the optical path 114 to receive the light signal. The light sensor 106 provides one or more p-n junctions along the extended effective junction distance D, schematically represented as a diode 111 in FIG. 1. The circuit structures 105 and 106 individually include bond pads 122 connected by bond wires 124 to corresponding electrical conductors 104a, 104b of a lead frame structure. The conductors 104a and 104b in one example are IC pins or pads that can be soldered to a host printed circuit board (PCB, not shown). In one example, an external circuit (not shown) provides an electrical signal to the light source 108 via a pair of input conductors 104a, and the light source 108 generates the light signal along the optical path 114 in response to the received electrical signal. In this example, the IC 100 also include bond pads 122 that are electrically connected by corresponding bond wires 124 to a second pair of leadframe electrical conductors 104b schematically shown in FIG. 1 to provide an electrical output signal from the light sensor 106. The conductors 104b in the illustrated examples provide pads or pins of the IC 100 that can be soldered to a host PCB to deliver an electrical signal from the sensor 106 that is isolated from the source signal at the conductors 104a. The isolation voltage rating or breakdown voltage of the isolator IC 100 in this example is set by a spacing distance or gap distance 116 separating the circuit structures 105 and 106 across a galvanic isolation boundary.

The signal output face 107a and the sensor face 107b lie in generally parallel planes, spaced from one another by the distance 116 in the cavity 110. In other possible examples, the faces 107 need not be parallel. Any relative configuration can be used in which the sensor face 107b at least partially faces the light source 108 so as to receive the light signal. The sensor face 107b allows light to enter the structure 106 to generate an output electrical signal corresponding to the intensity of the light signal. The sensor circuit 106 may include further interface circuitry (not shown) to operate on the sensor signal. As shown in FIG. 1, significant portions of the faces 107a and 107b are exposed within the cavity 110, although not a strict requirement of all possible embodiments. In the example of FIG. 1, the light source 108 and the light sensor 106 are spaced from one another in the internal cavity 110 of the molded package structure 102 to provide electrical isolation therebetween. The cavity 110 in this example provides the optical path 114 free of solids (i.e., solid-free). In other examples (e.g., FIGS. 3 and 4 below), glass or other optically transmissive solid structures can be provided between the light source 108 and the light sensor 106. The cavity 110 in one example is sealed, and includes air or other optically transmissive gas, which may advantageously have a lower dielectric constant than glass or other transparent solid materials, thereby reducing capacitive coupling between the optical source 108 and sensor 106. In the example of FIG. 1, the cavity 110 includes a concave upper surface 112, although not a strict requirement of all possible implementations. The cavity 110 can be formed in one example using deposited sacrificial sublimation material during formation of the molded structure 102, followed by evaporation or sublimation through a port 118 to create the solid-free cavity 110. The port 118 can then be closed by a tape or other closure structure 120 to form a seal of the cavity 110. The isolation gap or spacing 116 in certain examples is controlled by mechanical features on one of the dies or circuit structures 105, 106, such as oxide bumps (not shown) extending between the dies 105 and 106 to set the gap distance 116. The gap 116 is controlled in some examples by mixing filler material of a particular size with the sacrificial material used in forming the cavity 110. In the illustrated examples, the interior surface of the package structure 102 includes a concave portion, which can be provided by forming a sacrificial material during fabrication as a drop or one or more drops, such as using a printing process. This deposited sacrificial material thus forms a partially convex structure, and the material is later sublimated or evaporated after formation of the molded package structure material 102, leaving a concave inner surface. As shown in dashed line 113 in FIG. 1, the concave shape of the cavity inner surface can extend beyond the edges of the dies 105 and 106 to allow some light transfer out of the upper portion of the LED light source 105 and into the upper portion of the sensor die 106.

The IC 100 in one example is an optical isolation circuit to transfer data or power from an electrical circuit connected to the light source 108 to an electrical circuit (not shown) connected to the sensor 106. The light source 108 generates a light signal of a given wavelength $\lambda$ along the optical path 114. In one example, the light source is a lateral LED providing the signal at a wavelength $\lambda$ of about 950 nm. Any other suitable light source wavelength $\lambda$ can be used. As used herein, a light signal of a given wavelength $\lambda$ means the designated wavelength and possibly other wavelengths near the designated value, such as within a few percent of the designated value or any suitable wavelength tolerance associated with LEDs or other light sources used for optical isolation devices. In one example, the source 108 provides a long wavelength signal with an energy just above the bandgap energy of silicon to maximize the absorption depth in the semiconductor structure 101, 103 of the light sensor 106. A wavelength $\lambda$ with an energy level less than the bandgap energy of silicon will interact weakly with the silicon, whereas a $\lambda$ with an energy level greater or much greater than the bandgap of silicon will be strongly absorbed, but the energy portion greater than the bandgap is wasted as electrons quickly thermalize down. In certain examples, the lateral device is optimal for wavelengths at the bandgap energy where the silicon length can be increased to obtain maximum capture.

The light sensor 106 is designed for operation in receiving and capturing laterally received photons of the given wavelength $\lambda$. The light sensor 106 in the example of FIG. 1 includes a semiconductor structure having a top T and a bottom B, as well as a front side at least partially facing the optical path 114 to provide the sensor face 107b to receive the light signal from the source 108. The semiconductor structure further includes a back side spaced from the front side, and lateral sides extending vertically between the top T and bottom B, and horizontally between the front and back sides. In the illustrated examples, the semiconductor structure is generally rectangular, with generally parallel front and back sides, and the top and bottom are generally planar and parallel to one another. In addition, the illustrated example provides generally planar lateral sides. However, other semiconductor structure shapes can be used. Any suitable semiconductor structure can be used. In certain examples, the semiconductor structure is silicon (Si). In other examples, gallium arsenide (GaAs) or other suitable semiconductor materials can be used.

The semiconductor structure includes a p-doped portion 101 with boron or other p-type dopants. The p-doped portion 101 extends along at least a portion of the bottom B in certain implementations, as shown in FIG. 1. In one example, the semiconductor structure is fabricated beginning with a p-doped silicon substrate to form the portion 101. The p-type portion is electrically connected out the bottom B to a package electrical connector 104b. In other examples, p-type dopants are introduced into a semiconductor substrate by implantation and/or diffusion to form the p-doped portion 101. The semiconductor structure also includes one or more n-doped portions 103 including phosphorus or other n-type dopants at least partially adjacent to the p-doped portion 101. The n-doped portion electrically connect out the top T to electrical connections 122 and 124 to another package electrical connector (not shown). The n-doped portion or portions 103 form at least one p-n junction in the semiconductor structure. The resulting p-n junction or junctions extend by an effective junction distance D between the front side and the back side of the semiconductor structure. The effective junction distance D in certain examples is greater than a constant K times an absorption depth for the semiconductor structure that corresponds to the given wavelength $\lambda$, where K is greater than unity.

As used herein, the absorption depth for the semiconductor structure 101, 103 is a distance value (e.g., extending from the sensor face 107b to the right into the semiconductor structure in FIG. 1) for which the incident radiation intensity is reduced by 1/e or approx. 36%. At this distance, the amount of photon energy absorbed by silicon 101, 103 through the creation of electron/hole pairs would be approximately 64% of the given wavelength $\lambda$ received at the lateral sensor face 107b. In one example, K is greater than or equal to 5. In other examples, K is greater than or equal to 10. In further implementations, K is greater than or equal to 20. The junction distance D can be any suitable size within the practical physical limitations of a given end-use application, e.g., where K is less than 1000. The n-doped portion in one example extends along at least a portion of the top T, although not a requirement of all possible implementations. The extended effective p-n junction distance D facilitates absorption of a high percentage of the incident photons received at the lateral sensor face 107b. For example, as illustrated and described further below in connection with FIGS. 9 and 10, photon capture and resulting carrier generation is highly probable at or near the entrance at the sensor face 107b of the semiconductor structure, and the probability of photon capture decreases with increasing distance from the front of the semiconductor structure. In disclosed lateral devices, the lateral dimension is the planar (horizontal) distance of a standard thickness silicon wafer. In many manufacturing processes, a silicon wafer is background to about 10 mils thick, and the standard vertical photovoltaic sensor would only have a path length of about 254 microns. Of this path length, moreover, only the top 20 microns or so is useful for photon capture. A long junction could be constructed by building a very thick, multi-junction piece of vertical silicon and laying the assembled die stack on its side. However, this would be very non-standard and impractical method in comparison lateral device constructions.

Making the semiconductor structure to include one or more n-doped portions 103 extending or distributed throughout substantially all of the effective p-n junction distance D facilitates high efficiency photon capture probability by making D large relative to the absorption depth corresponding to a particular semiconductor material and the corresponding given wavelength $\lambda$. For example, high-efficiency LED light sources 108 can be used to transmit photons at a wavelength $\lambda$ of approximately 950 nm. Using a silicon semiconductor structure with suitably doped p and n portions 101 and 103, approximately 64% of the received photon energy is absorbed in the first 80 um of travel for the 950 nm source. The inventor has appreciated that high absorption percentage is achieved for K greater than or equal to 5, and further improvement is achieved by using K greater than or equal to 10. Moreover, near complete (e.g., close to 100%) absorption can be achieved for K greater than or equal to 20. In the example of FIG. 1, the effective p-n junction distance D is implemented by creating multiple p-n junctions via corresponding n-doped regions 103 implanted and/or diffused in the top of the p-doped portion 101.

Although the example of FIG. 1 shows five such n-doped regions 103 to create p-n junctions throughout substantially all of the distance D, a large number of n-doped regions 103 can be used to create a corresponding large number of p-n junctions. Although the illustrated n-doped regions 103 are substantially uniformly spaced between the front and back the lateral semiconductor structure, uniform spacing is not a strict requirement of all possible implementations, and multiple spacings and feature sizes can be used in various embodiments.

The resulting structure 101, 103 provides multiple p-n junctions along a generally straight corridor to facilitate high collection probability. In various embodiments, multiple such semiconductor structures can be employed (e.g., FIG. 4), and the corresponding optical corridors can be electrically isolated. Interconnection circuitry can be provided in the IC 100 in order to connect the resulting p-n extended junction cells in any desired series and/or parallel configurations. The individual semiconductor structures, moreover, can include upper and lower (e.g., top and bottom) reflective materials or structures 109 to provide internal reflection to facilitate capture of most of the received photon energy, and to optically isolate each channel from adjacent optical circuits. This multichannel concept, moreover, can be extended to use in power transfer as well as data transfer applications, where the optical isolation of different channels facilitates minimization of cross talk for communications applications. As shown in FIG. 1, moreover, and optically reflective material 109 can be provided at the back side of the semiconductor structure 101, 103 in order to cause any photons encountered at the backside to be reflected back towards the sensor face 107b, thereby further improving collection efficiency. Similarly, optically reflective material can be provided on the lateral sides (not shown) of the semiconductor structure 101, 103 in certain embodiments, and order to further enhance the probability of a given incident photon being collected by the sensor structure.

As previously mentioned, multiple semiconductor structures 101, 103 can be included in certain examples, and these cells can be stacked or otherwise interconnected in any suitable series and/or parallel fashion to achieve a desired output voltage and/or current. In certain examples (e.g., FIGS. 6-8 and 23), a single, extended p-n junction is provided in the individual semiconductor structures 101, 103 to create a single p-n junction having a junction distance D by using a single n-doped portion 103. In other examples (e.g., FIGS. 1-5, and 12-22), each semiconductor structure 101, 103 includes a plurality of n-doped portions 103 including n-type dopants to form a plurality of p-n junctions throughout substantially the entire effective junction distance D between the front and back sides. The resulting light sensor 106 can be used for data and/or power transfer in certain applications. In addition, the extended junction lateral sensor structure 106 can also be used in photon multiplier applications, for example, in photon detector systems that discussed further below in connection with FIGS. 22 and 23. Unlike conventional optocouplers, the extended junction devices and systems of the present disclosure facilitate high current transfer ratios (CTR) in power supply applications, thus facilitating high-efficiency biasing of circuits separated by a galvanic isolation barrier. Moreover, the distance 114 in FIG. 1 can be sized according to any desired breakdown voltage or isolation voltage rating for a given application. This isolation level adjustability, moreover, does not involve increase in the vertical height of the IC 100, as was the case with conventional vertically oriented optocouplers.

In operation of the light sensor 106, incident photons received laterally through the sensor face 107b are absorbed at or near the extended p-n junction formed by the doped regions 101 and 103. In one form of operation, the sensor 106 and the corresponding extended p-n junction thereof operates as a photodiode in photovoltaic mode to generate carriers and corresponding current flow to generate electrical output signal for use in power supply biasing and/or for data transfer. In particular, once a photon of sufficient energy is received, an electron/hole pair is created through an inner photoelectric effect in the semiconductor structure 101, 103. If the absorption occurs at or near the depletion region of the extended p-n junction, carriers move away from the junction according to an electric field of the depletion region, with holes moving toward the anode (p-doped region 101) and electrons move toward the cathode (n-doped region or regions 103). This carrier movement generates current flow, which can be used to generate electrical signal to an associated circuit connected to the sensor 106. For example, a low dropout (LDO) regulator or other power supply circuit can use the photo generated current to supply power to an external circuit connected to the sensor 106. In other examples, the electrical current flow generated by the sensor 106 can be used as a received data signal by an external circuit connected to the sensor. As discussed below in connection with FIGS. 22 and 23, a generated signal from the sensor circuit 106 can be used to indicate detection of an individual received photon, for example, in silicon photon multiplier circuits.

Figure 2:
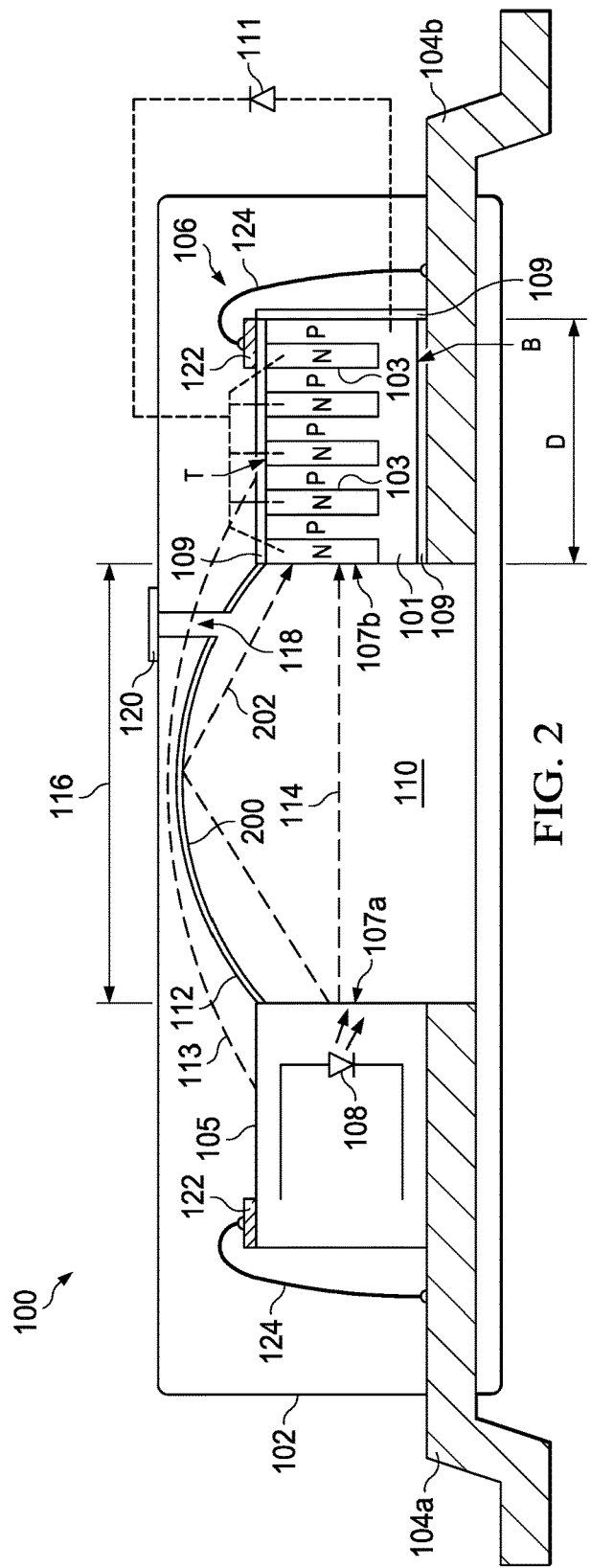
FIG. 2 is a sectional side elevation view of another optical isolation IC embodiment with an LED light source and a lateral photodiode sensor, including a reflective coating formed on a concave surface of the package cavity.

FIG. 2 shows another example isolation IC embodiment 100 with an LED light source 108 and an extended junction lateral light sensor 106 as described above. In this example, the interior surface of the cavity 110 includes a reflective coating 200 that reflects light from the light source 108 toward the light sensor 106, for example, along an optical path 202. The reflective coating material 200 in one example is deposited over a convex sacrificial sublimation material prior to the molding process that creates the molded package structure material 102. Sublimation of the sacrificial material layer after the molding process leaves the cavity 110 defined at least in part by the concave surface of the remaining reflective material layer 200. Any suitable non-conductive material 200 can be used which facilitates reflection of all or part of the light signal generated by the light source 108 toward the light sensor 106. As shown in FIG. 2, the light signal from the source 108 can travel through the cavity 110 along the optical path 114 directly to the sensing face 107b of the sensor die 106, and/or the signal can also travel along a reflected path 202 via the reflective coating 200 on the concave surface 112. In other possible examples, the concave surface 112 of the cavity 112 and any corresponding reflective coating 200 can be laterally extended to expose at least a portion of the top of the light sensor semiconductor structure, thereby allowing reflected photons to enter the top of the semiconductor structure for potential capture in the sensor 106.

Figure 3:
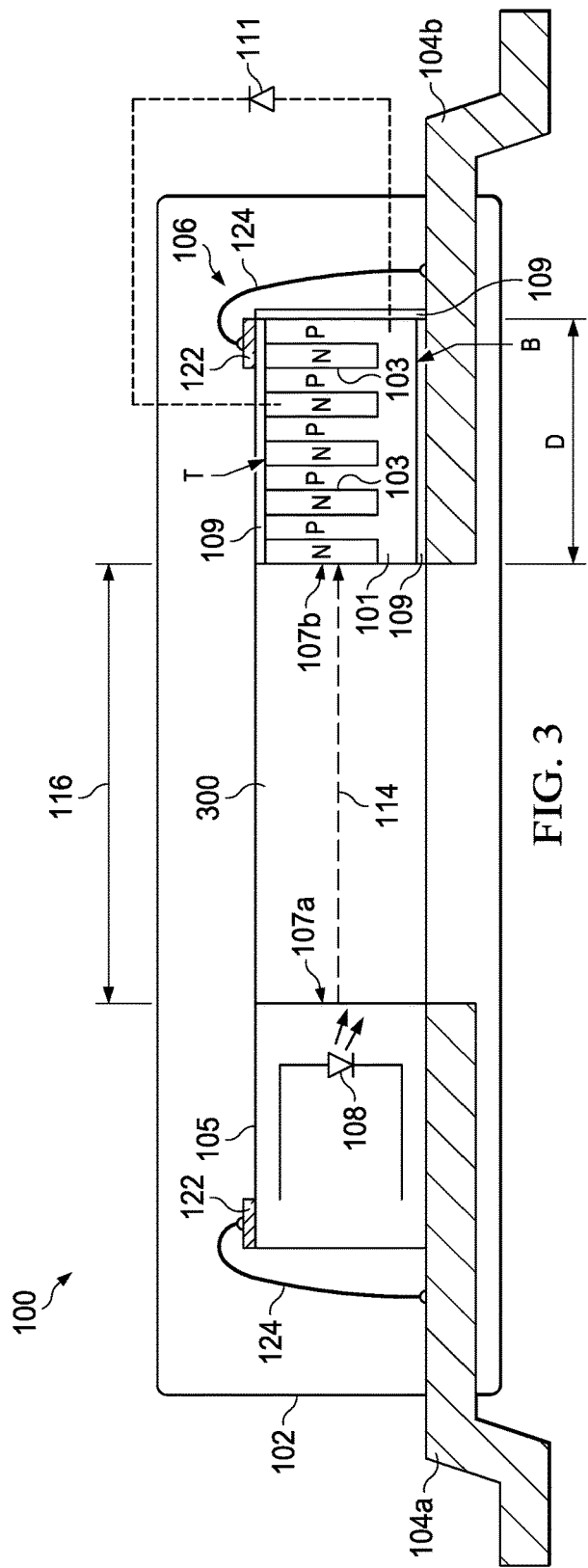
FIG. 3 is a sectional side elevation view of another optical isolation IC embodiment with a glass or plastic optical transmission medium position between the LED light source and the lateral photodiode sensor.

FIG. 3 shows another non-limiting example isolation IC 100 with a light source 108 and a light sensor 106 as described above. In this example, an optically transmissive structure 300 is disposed between the faces 107a and 107b of the light source 108 and the light sensor 106 along the optical path 114. Any suitable material 300 can be used, such as glass, polymer, etc.

Figure 4:
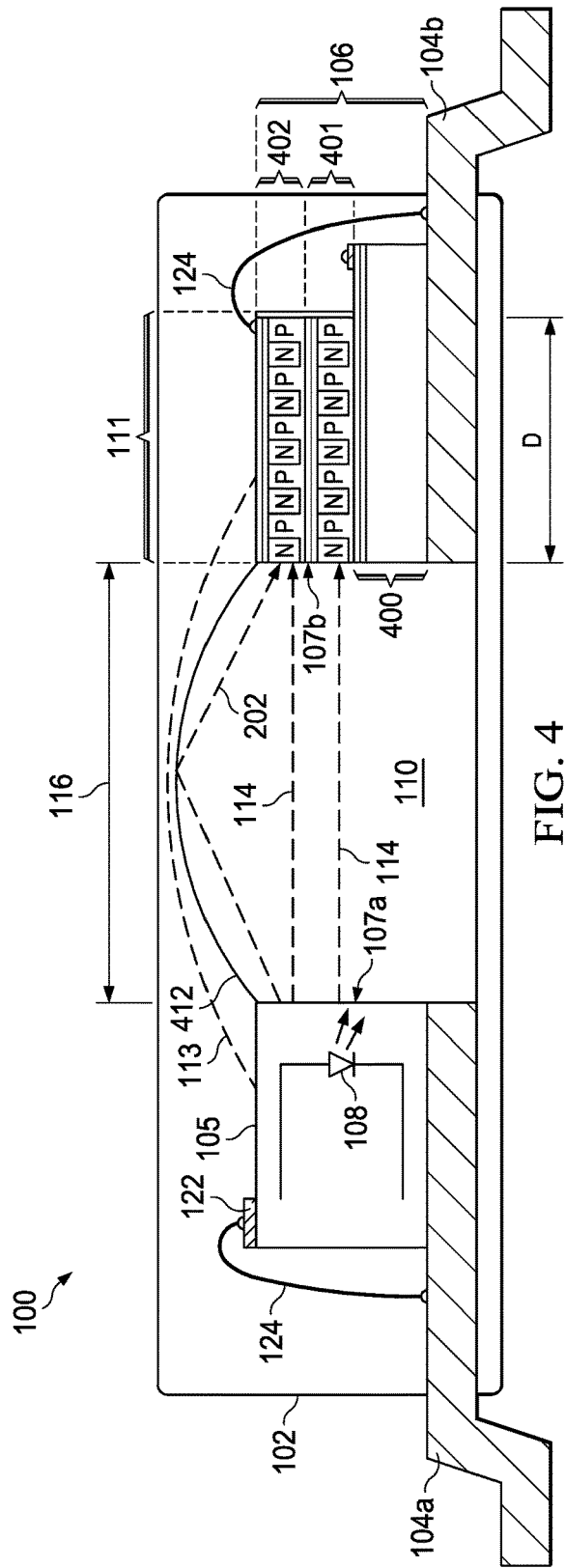
FIG. 4 is a sectional side elevation view of another optical isolation IC embodiment with a light sensor including two vertically stacked lateral photodiode semiconductor structures individually including a plurality of p-n junctions to form a lateral multistage photovoltaic (LMSPV) light sensor.
Figure 5:
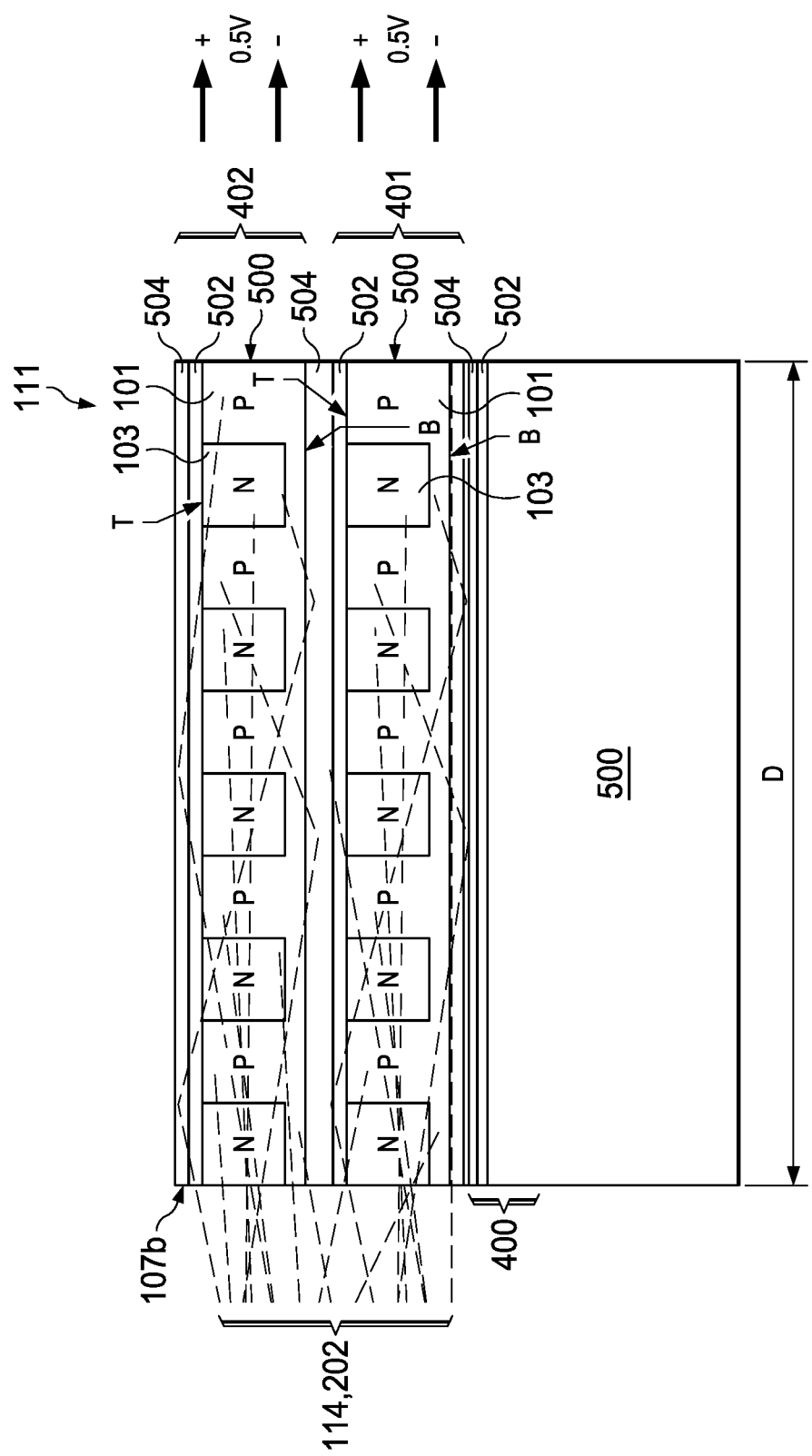
FIG. 5 is a partial sectional side elevation view of optical reception in the light sensor of FIG. 4.

Referring also to FIGS. 4 and 5, FIG. 4 shows another optical isolation IC embodiment 100. In this example, the light sensor 106 includes a plurality of series-connected diodes, each including p and n doped portions of a corresponding semiconductor structure 401, 402 as described above. The light sensor 111 in this example includes two series connected photo diodes formed by two (e.g., lower and upper) substrates or dies 401 and 402, although any number 2 or more such stacked dies can be used. In one example, the dies 401, 402 each include an upper reflective coating material, for example formed by an oxide layer 502 and an upper passivation layer 504 on the top T of the corresponding semiconductor structure. Reflective silver bearing epoxy is used on the bottom B of each of the semiconductor structures in order to form a bottom reflective surface to contain photons within the individual semiconductor structures, and to bond the upper semiconductor structure/die 402 to the lower die 401. In this example, the light sensor structure 106 also includes a base die 400 with a semiconductor substrate including any desired amplifiers, filters or other interface circuits (not shown), with the lower sensor die 401 being mounted to the top of the base die 400 using an optically reflective silver bearing epoxy for attachment and also for photon reflection in the die 401. The dies 401 and 402 are back-ground in one example to have a smaller vertical height than the base die 400. In one example, the stacked dies 401 and 402 each include metallization structures to provide an upper electrical connection to the n-doped portions 103, and the silver bearing epoxy used to join the dies 401 and 402 together can provide an electrical connection from the n-doped portions of the lower die 401 to the p-doped portion of the upper die 402 to effectively connect the corresponding diodes in series with one another. In one example, the individual dies 401 and 402 each generate a voltage signal of approximately 0.5 V, and the stacked dies 401 and 402 can be interconnected in series to provide a higher output voltage signal to an external circuit (e.g., 1.0 V). Embodiments having more than 2 stacked dies can be interconnected in any desired series and/or parallel configuration to achieve a desired output signal level in response to the light signal from the light source 108.

Figure 6:
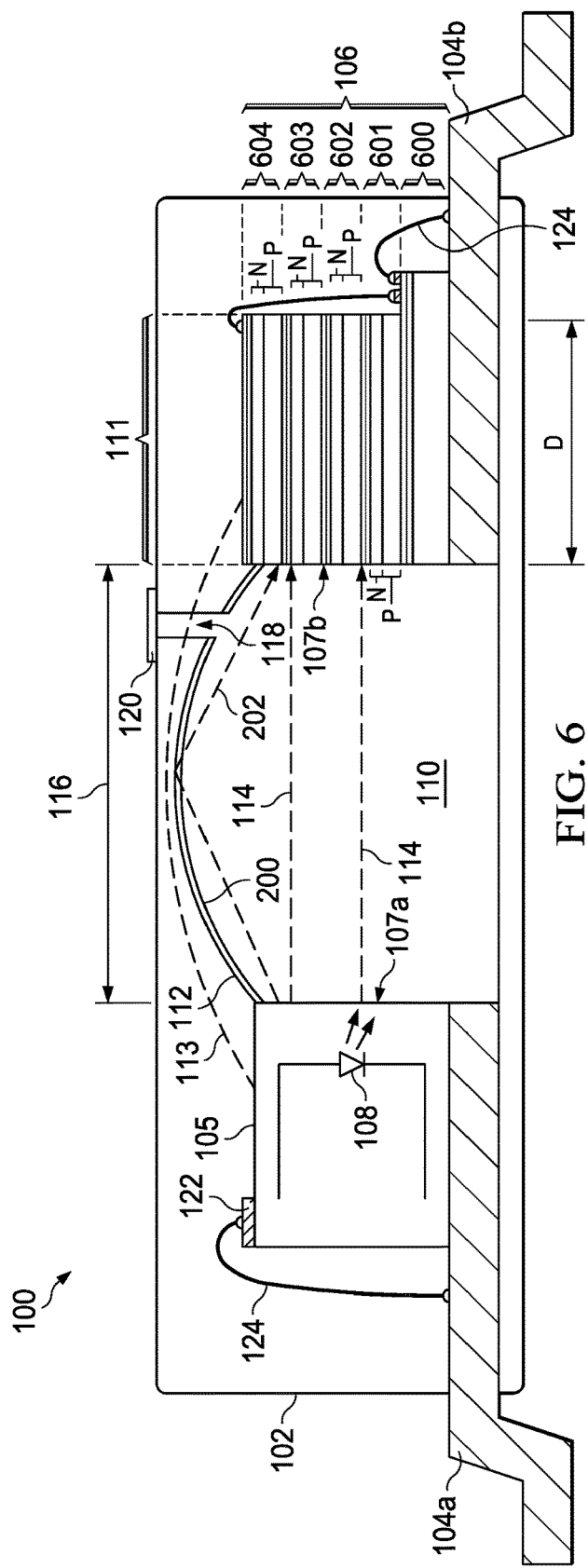
FIG. 6 is a sectional side elevation view of another optical isolation IC embodiment with a light sensor including four vertically stacked lateral photo diode semiconductor structures individually including a single extended p-n junction.
Figure 7:
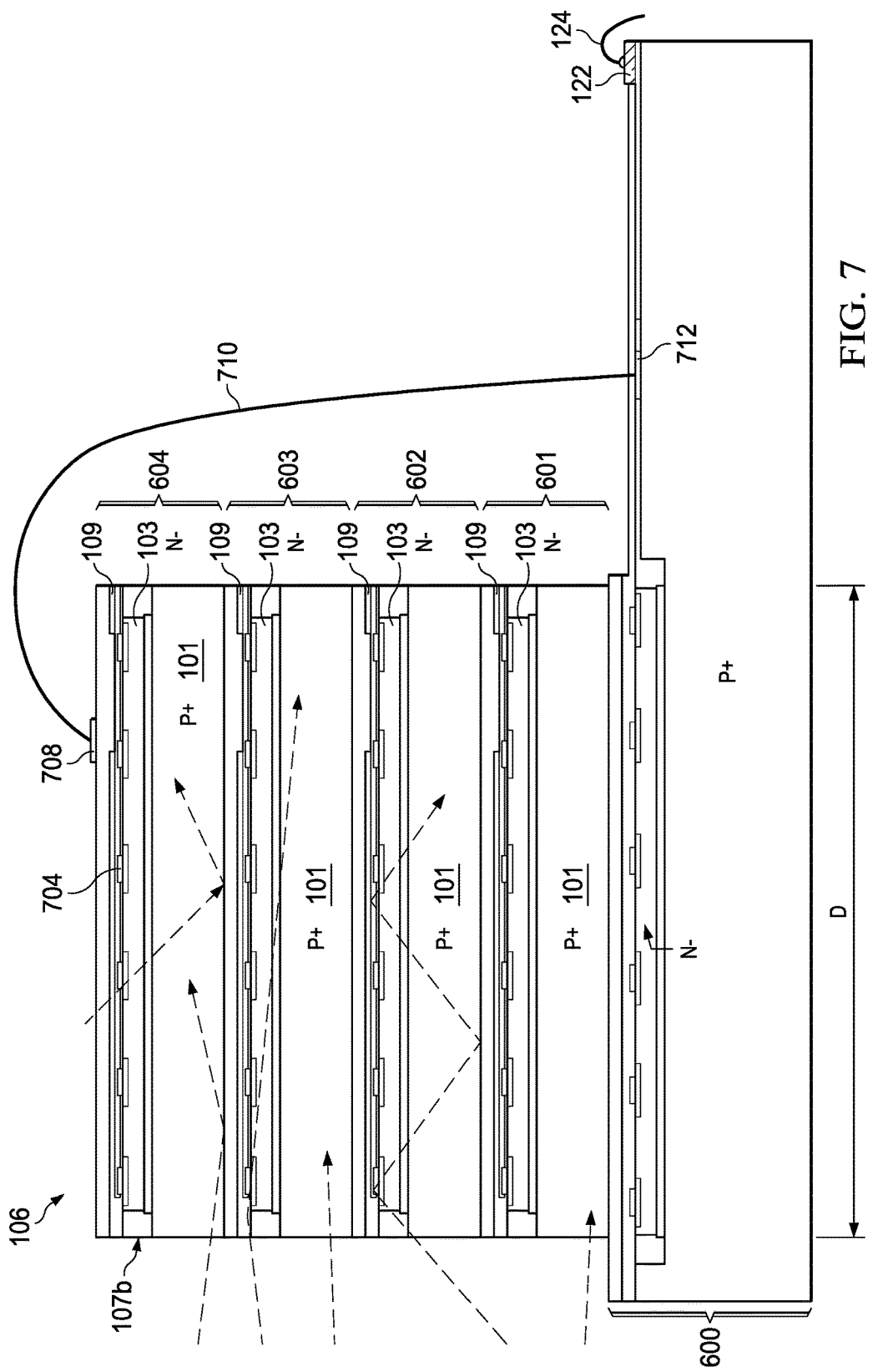
FIG. 7 is a partial sectional side elevation view of optical reception in the light sensor of FIG. 6.

FIGS. 6 and 7 show another isolation IC example 100 using multiple stacked diodes in the optical sensor 106. The second circuit structure 106 in FIG. 6 is a multi-die structure with vertical diodes that individually include a single p-doped portion and a single extended n-doped portion. As with the above-described embodiments, this example provides an extended lateral p-n junction structure with an effective junction distance D that is longer than the absorption depth for the semiconductor structure that corresponds to the given wavelength λ. The sensor structure in FIGS. 6 and 7 includes four stacked dies 601, 602, 603 and 604 formed on a base die 600, although any number of dies can be used. FIG. 7 shows several example light travel paths in the various dies 601-604.

Figure 8:
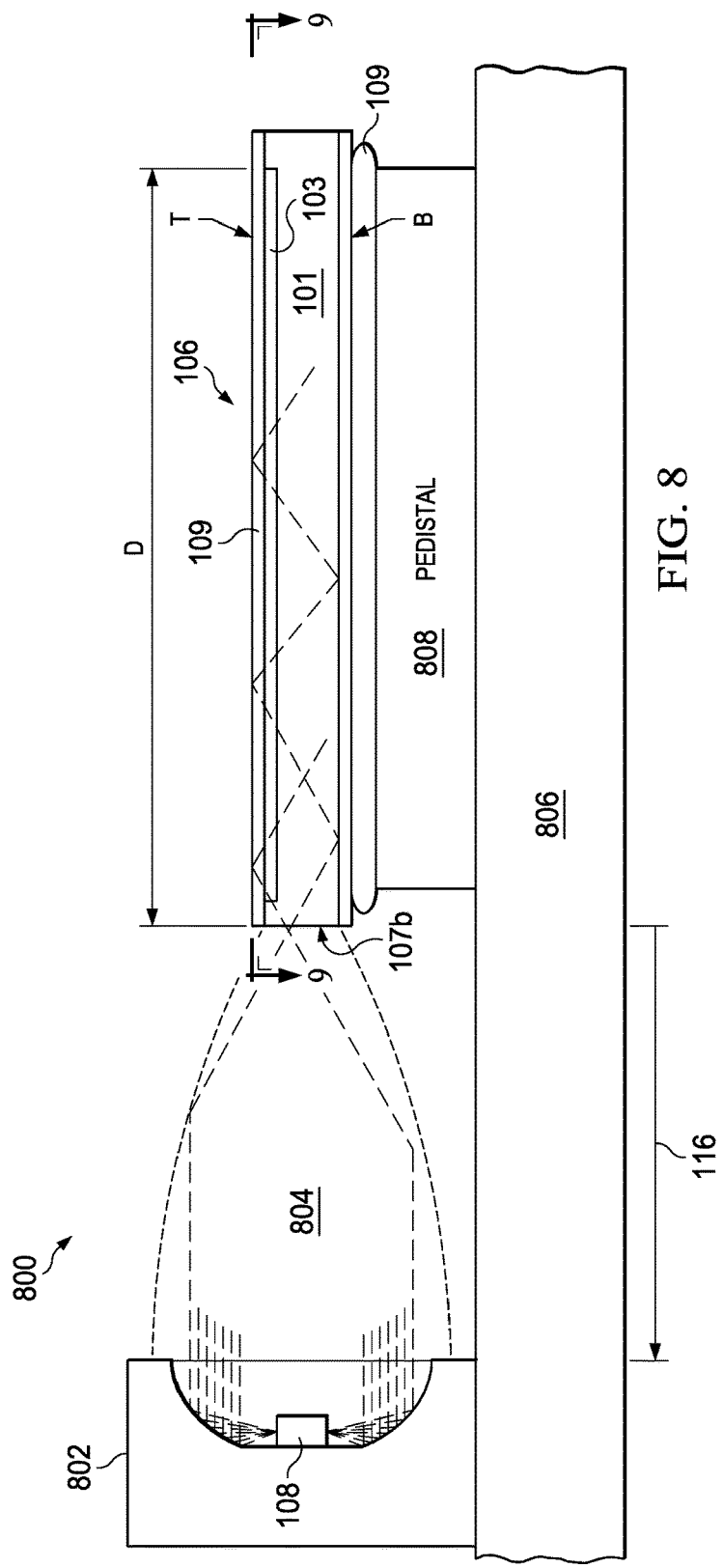
FIG. 8 is a sectional side elevation view of another example isolation circuit including an infrared or near infrared light source with a parabolic focusing mirror and a photo diode semiconductor structure including a single extended p-n junction.
Figure 10:
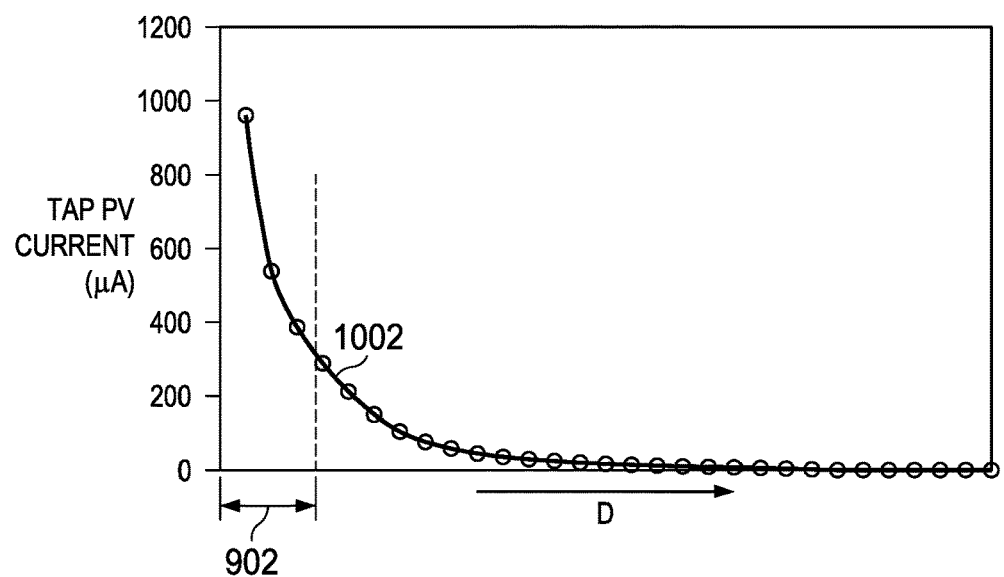
FIG. 10 is a graph of collected tap current as a function of the effective junction distance in the semiconductor structure of FIG. 9.

Referring now to FIGS. 8-10, FIG. 8 shows an example optical isolation circuit 800, including an LED light source 108 equipped with a parabolic reflector mirror structure 802. In one example, the light source 108 is an OSRAM SFH-4441 940 nm LED rated at 50 mW at 100 mA. An optical coupler structure 804 is provided between the LED/mirror components 108, 802 and the sensor face 107b of a semiconductor structure including a single p-doped portion 101 and a single extended length n-doped portion 103 as previously described. In this example, K is approximately 7. This example includes a reflective coating material 109, such as an oxide, on the top T of the semiconductor structure, as well as a reflective material 109 (e.g., reflective epoxy) on the bottom B to facilitate photon reflection as shown in simplified form in FIG. 8 for enhanced capture probability. The semiconductor structure 101, 103 is mounted via the epoxy 109 to a pedestal 808, and the source and sensor structures are mounted to a base 806 in a spaced relationship to define the spacing or gap distance 116 to set the isolation level of the isolation circuit 800. In certain examples, electrical connections (not shown) are made to the n and p regions at the top side T.

FIG. 9 shows a top view of the semiconductor structure 101, 103 taken along line 9-9 in FIG. 8. The structure includes one or more conductive taps 904 connected to corresponding areas of the n-doped portion 103 to collect photo-generated current based on capture of photons entering the sensor face 107b.

FIG. 10 provides a graph 1000 showing a curve 1002 representing tap current at the tap locations 904 in FIG. 9 in µa as a function of the distance from the sensor face 107b. As previously discussed, the probability of photon capture, and hence the magnitude of the photon-generated tap current, is highest at or near the sensor face 107b, and decays with increased distance in the semiconductor structure. In this example, approximately 64% of the total generated tap current is generated throughout an initial distance 902 from the sensor face 107b, corresponding to the absorption distance for the given semiconductor material and the given wavelength $\lambda$.

Figure 11:
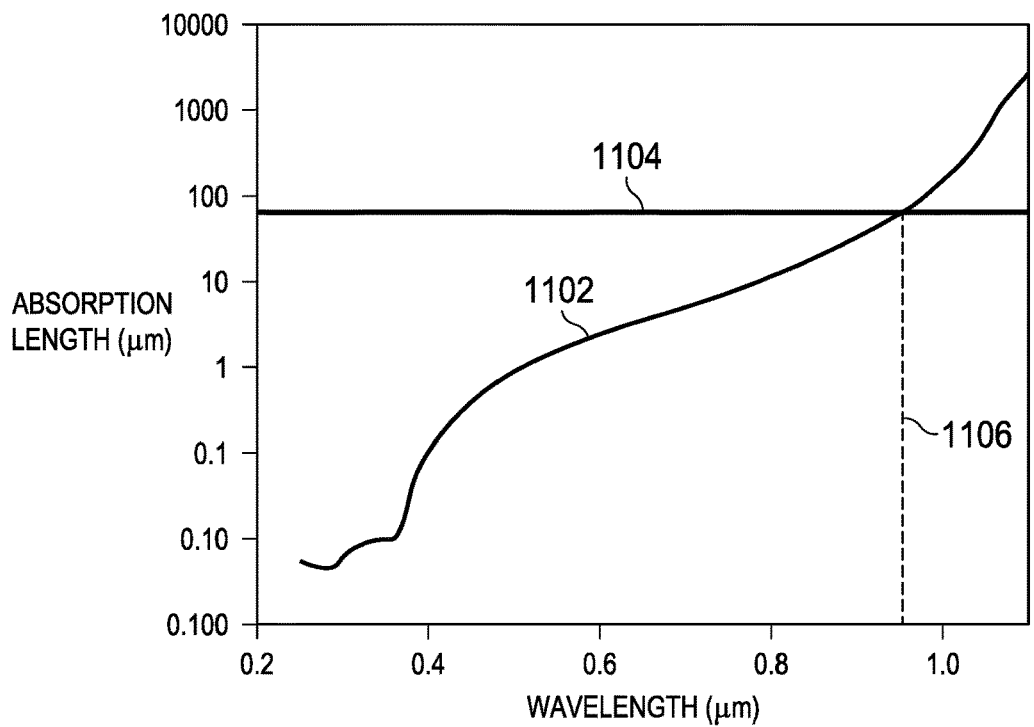
FIG. 11 is a graph of an example absorption depth curve as a function of photon wavelength for silicon.

FIG. 11 shows a graph 1100 including an example absorption depth curve 1102 as a function of wavelength $\lambda$ (µm) for a silicon semiconductor structure 101, 103. In this example, the depth for 64% absorption of incoming photons at a photon wavelength of 940 nm is approximately 95 um. Using this principle, a given light sensor 106 can be designed with a sufficient effective junction distance D to achieve a desired collection efficiency target for a given light source wavelength $\lambda$ and semiconductor material.

Referring also to FIGS. 12-21, a variety of different circuit structures and devices can be created using the extended junction light sensors 106. As mentioned above, certain examples include potentially large numbers of individual sensor cells, each including a semiconductor structure with a p-doped portion and one or more n-doped portions to create a cell having a lateral sensor face 107b and an extended effective junction distance D that is longer than the absorption depth of the corresponding semiconductor material for a given light source wavelength $\lambda$. The combination of multiple lateral cells interconnected in a series and/or parallel configuration is referred to herein as a multistage photovoltaic (LMSPV) sensor structure 106.

Figure 12:
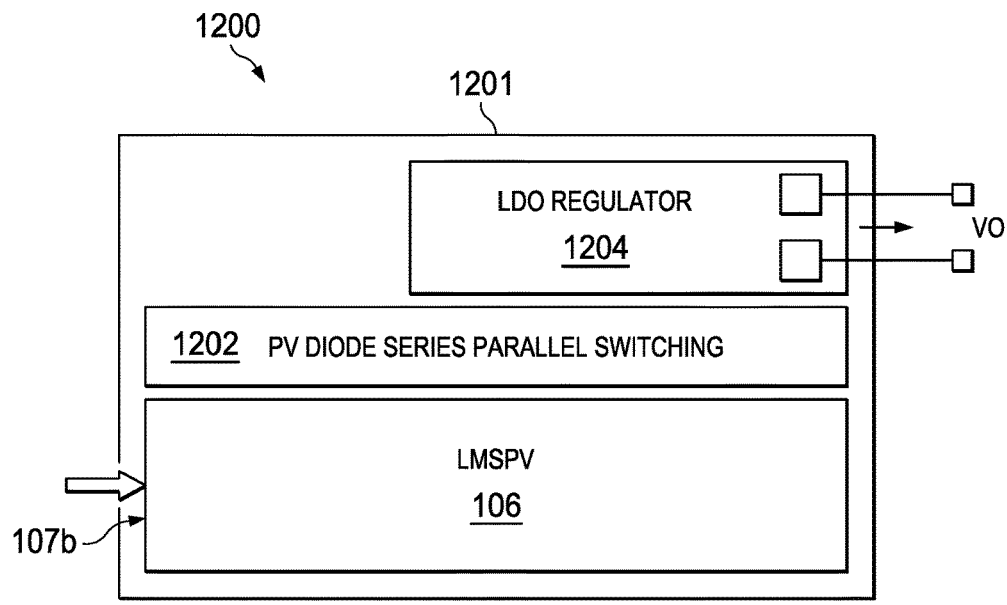
FIG. 12 is a simplified schematic diagram of an example isolated low dropout (LDO) regulator including an LMSPV pv bias generator array.

FIG. 12 illustrates an example isolated low dropout (LDO) regulator device 1200 including a sensor structure implemented on an integrated circuit die or packaged multi-die device 1201. In this example, the sensor circuit 106 is formed as an LMSPV structure to receive light from a lateral sensor face 107b as previously described. The n and p-doped portions of the LMSPV 106 are electrically connected to a switching circuit 1202 to electrically interconnect the p-n junctions of the plurality of semiconductor structures 101, 103 of the LMSPV 106. In one example, the switching circuit 1202 is programmable or otherwise configurable to allow changes to the series and/or parallel interconnections such that the device 1201 will provide an output signal (e.g., output voltage VO in FIG. 12) having configurable voltage and current values. An electrical signal provided from the LMSPV 106 through the switching circuit 1202 is delivered to an LDO regulator circuit 1204. The regulator circuit 1204 provides the output signal VO to drive a load (not shown). The device 1200 advantageously provides high current transfer ratio between a matched light source (not shown) and the LMSPV light sensor 106 to implement a higher efficiency power supply with optical isolation across a galvanic isolation barrier.

Figure 13:
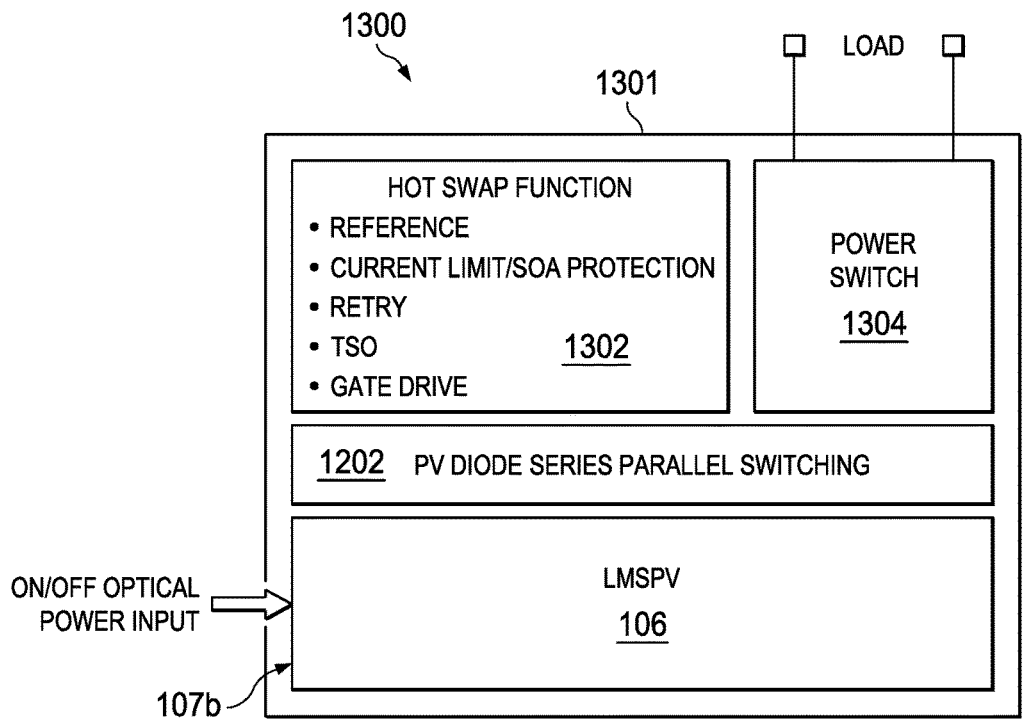
FIG. 13 is a simplified schematic diagram of an example solid state relay (SSR) including an LMSPV pv bias generator array.

FIG. 13 illustrates an isolated solid state relay (SSR) device 1300 including an LMSPV 106 with a sensor face 107b to receive a light signal pulsed on or off to selectively turn on power to a load. In one example, the device 1300 is packaged in a single integrated circuit die or packaged multi-die structure 1301, including the LMSPV 106, a series/parallel switching circuit 1202 as described above, application-specific analog circuits 1302 for implementing hot-swap functionality, and a power switch 1304. In one example, the device 1300 is used for an isolated power switch. The device 1300 advantageously facilitates provision of on or off control signaling through the LMSPV 106 from a signal source electrically isolated from the secondary side of the power supply circuit.

Figure 14:
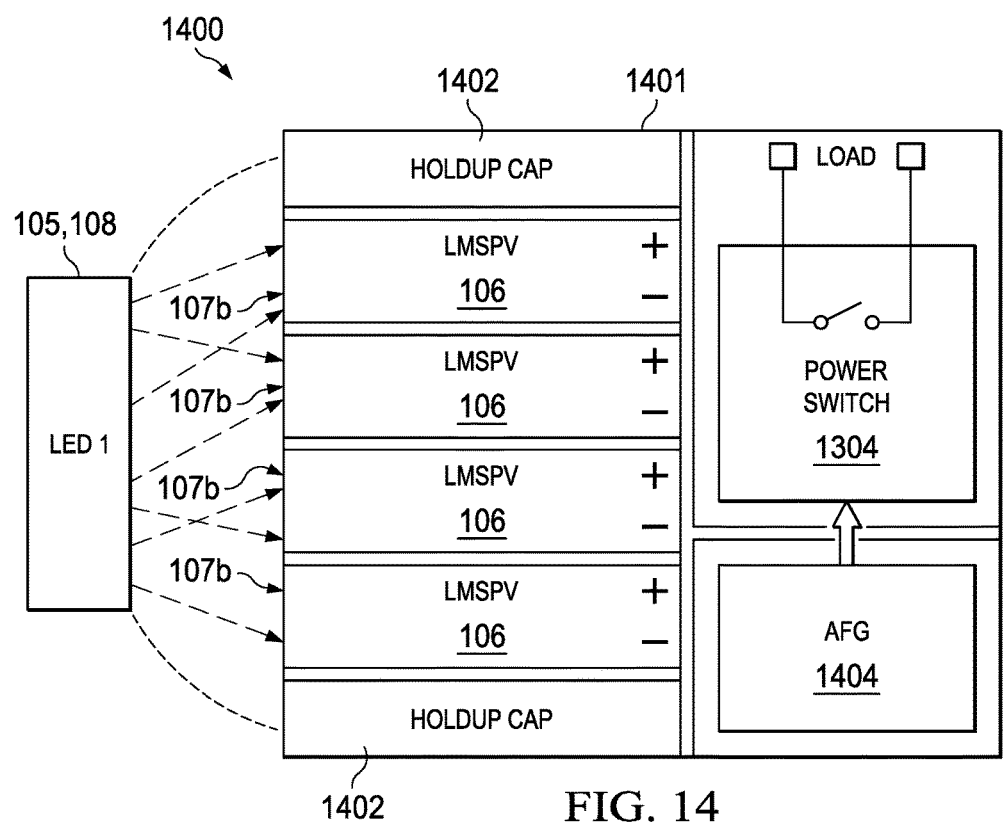
FIG. 14 is a simplified schematic diagram of an example isolated latching SSR including an LMSPV light sensor.

FIG. 14 shows an isolated latching SSR device 1400 packaged in a single integrated circuit die or packaged multi-die structure 1401 with multiple LMSPV circuits 106 and corresponding lateral sensor faces 107b, as well as upper and lower holdup capacitors 1402, and gate drive circuit 1404 and a DC or AC power switch 1304 to control a load. The device 1401 receives the light at the sensor faces 107b from an LED light source 105, 108 as previously described. The holdup capacitors 1402 provide latching of an output signal obtained from the LMSPV structures 106 to allow a received light signal to actuate and latch the power switch 1304.

Figure 15:
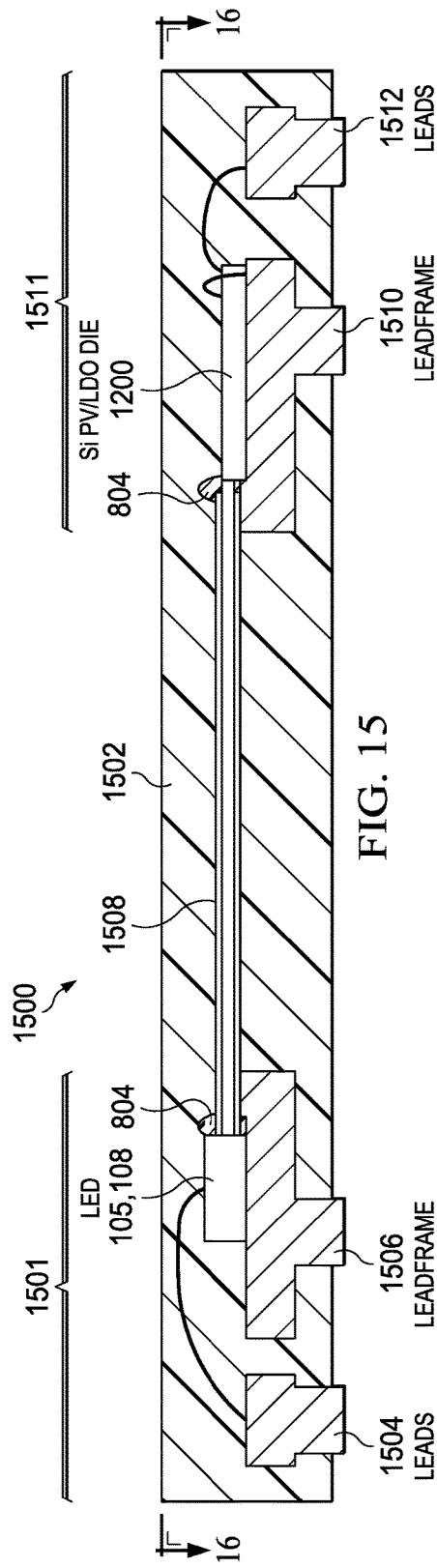
FIGS. 15 and 16 are partial schematic sectional side elevation and sectional top plan views of an elongated isolation circuit including a light source and an LMSPV light sensor. Connected by an optical fiber.
Figure 16:
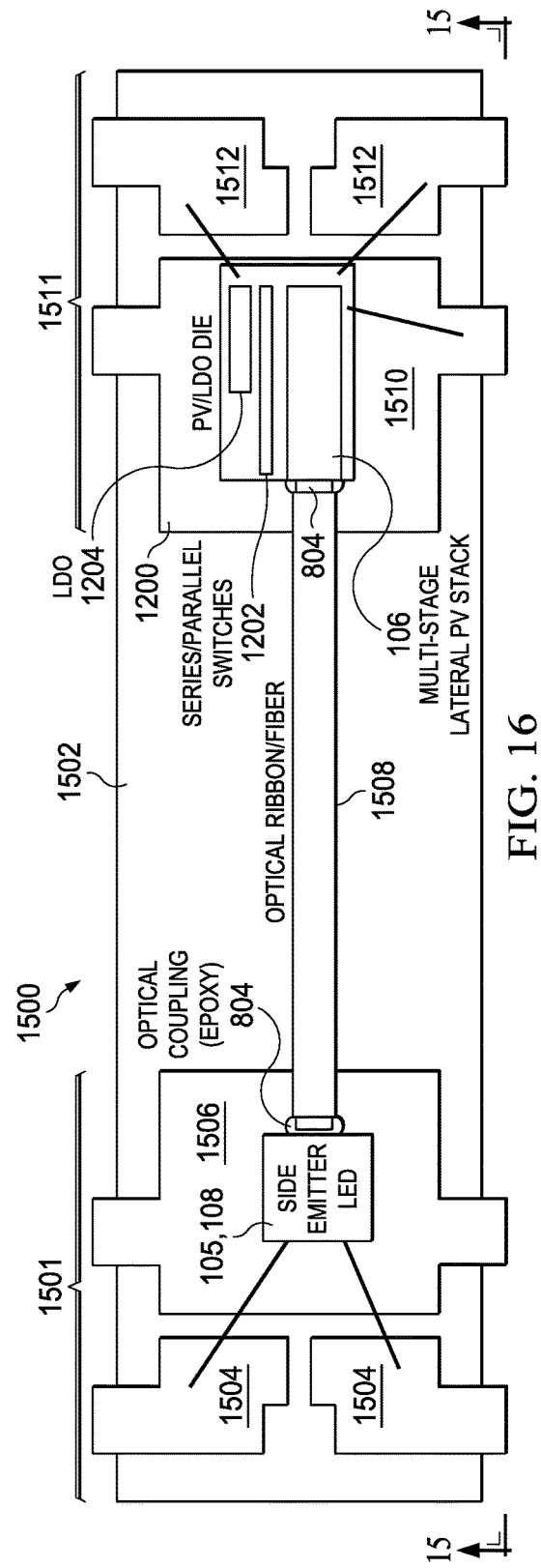

FIGS. 15-17 illustrate optically isolated power supply solutions using the example LDO regulator device 1200 of FIG. 12 in combination with an optical ribbon or fiber 1508. FIGS. 15 and 16 respectively show side and top views of an isolated power supply device 1500 packaged in a molded compound material 1502. A source side circuit 1501 includes a lead frame structure with leads 1504 and 1506, such as pins or pads that can be soldered to a host printed circuit board (not shown), with a light source (e.g., side or lateral emitting LED) 105, 108 and optically coupling material 804 connected to an input side of the optical ribbon or fiber 1508. The output end of the optical ribbon or fiber 1508 is connected via a corresponding optical coupling material 804 to the lateral sensor face 107b of an LMSPV structure 106. The power supply device 1500 also includes a load or output side circuit 1511 including an LDO regulator device 1200 as described above in connection with FIG. 12. The regulator device 1200 in this example is mounted to an output side lead frame structure including leads 1510 and 1512 to provide an electrical output signal (e.g., output voltage or current) to a driven load circuit connected to the host printed circuit board. The device 1500 in FIGS. 15 and 16 advantageously provides an optical power supply isolation solution in a single device, and advantageously uses the high current transfer ratio and high efficiency advantages of the LMSPV structure or structures 106 to transfer power across a galvanic isolation barrier without the space, cost, and electromagnetic interference shortcomings of transformer isolation techniques for power transfer.

FIG. 17 shows another optical isolation system 1700 for power transfer between two separate systems. In this example, the source side circuitry 1501 is packaged in a first integrated circuit die or packaged multi-die structure 1701 including a lead frame structure with leads 1504 and 1506.

An optical fiber or ribbon 1508 connects the first structure 1701 to a second IC die or packaged multi-die structure 1702 that includes the second lead frame structure with leads 1510 and 1512 and the regulator device 1200 described above. The optical isolation system 1700 provides an integrated solution to bias or power a load across an isolation barrier by simple connection of an optical ribbon or fiber 1508 between the die structure 1701 and 1702.

Figure 18:
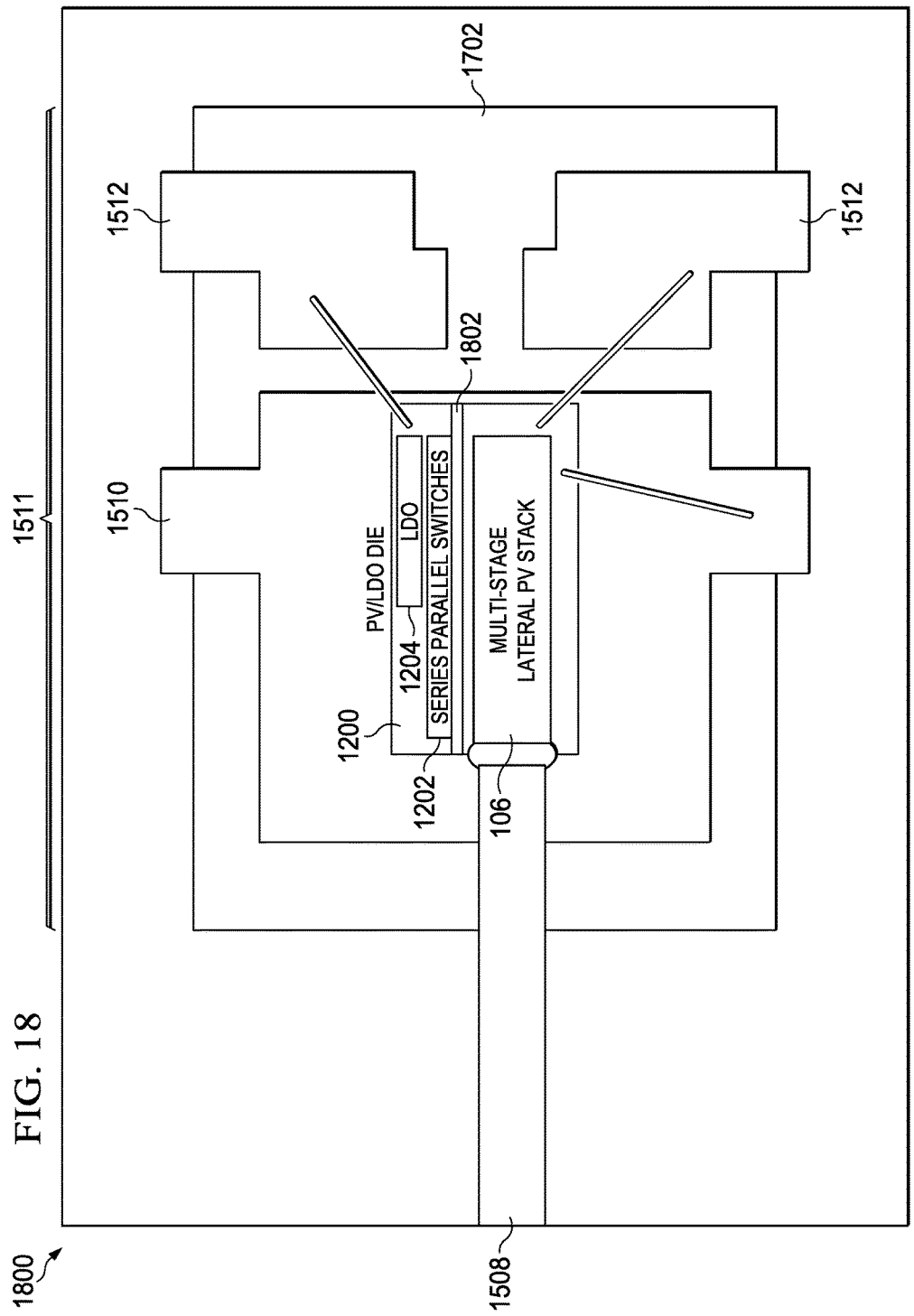
FIG. 18 is a partial schematic top plan view of an example LDO regulator including an LMSPV light sensor with a black polymer optical barrier formed between the LMSPV light sensor and other circuitry that can be used in the system of FIG. 17.

FIG. 18 shows another example of a load side circuit 1511 implementing an LDO regulator system 1800. The load site circuit 1511 in this example includes a regulator structure 1200 with an LMSPV structure 106, as well as a switching circuit 1202 and a regulator circuit 1204 as described above. The circuits and structures 106, 1202 and 1204 in this example are fabricated on a single semiconductor die 1200. This example further includes an optical isolation barrier structure 1802. In one example, the optical isolation barrier structure 1802 includes black polymer or other light blocking material formed in trenches of the semiconductor die. In one example, the LMSPV semiconductor structures 106, including the p and n-doped portions 101 and 103 are formed in a silicon structure, along with the switching circuitry 1202 and the regulator circuitry 1204. A trench is formed to separate the LMSPV structures 106 from the switching circuit 1202, and the trench is filled with black polymer. Thereafter, the die is back-ground to expose the polymer in the trench. The resulting structure is held together by the polymer, and the polymer forms an optical barrier to isolate the LMSPV structure 106 from the switching circuit 1202 and LDO circuit 1204.

Figure 19:
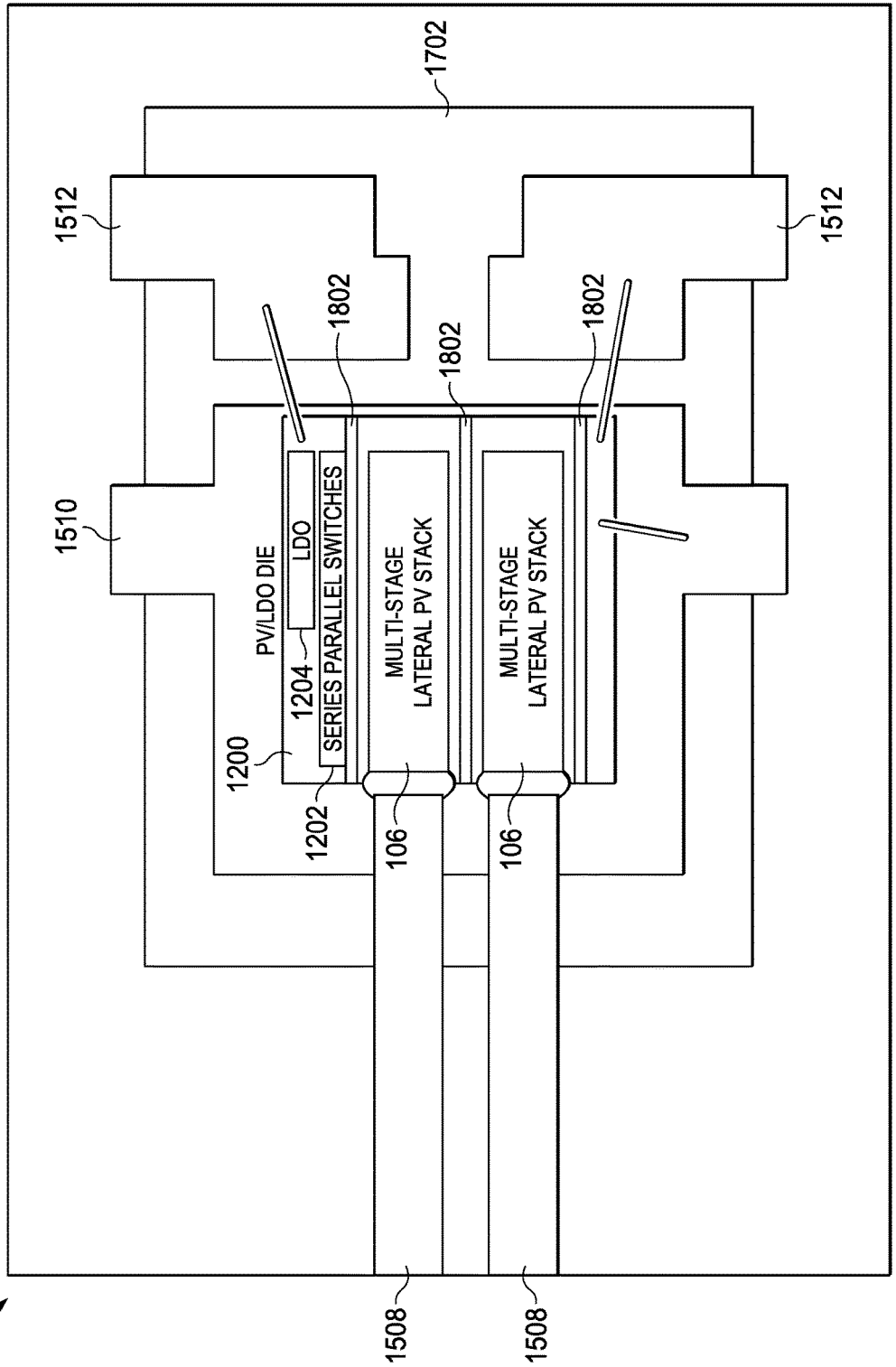
FIG. 19 is a partial schematic top plan view of an example LDO regulator with multiple LMSPV light sensor channels separated by a black polymer barrier.
Figure 20:
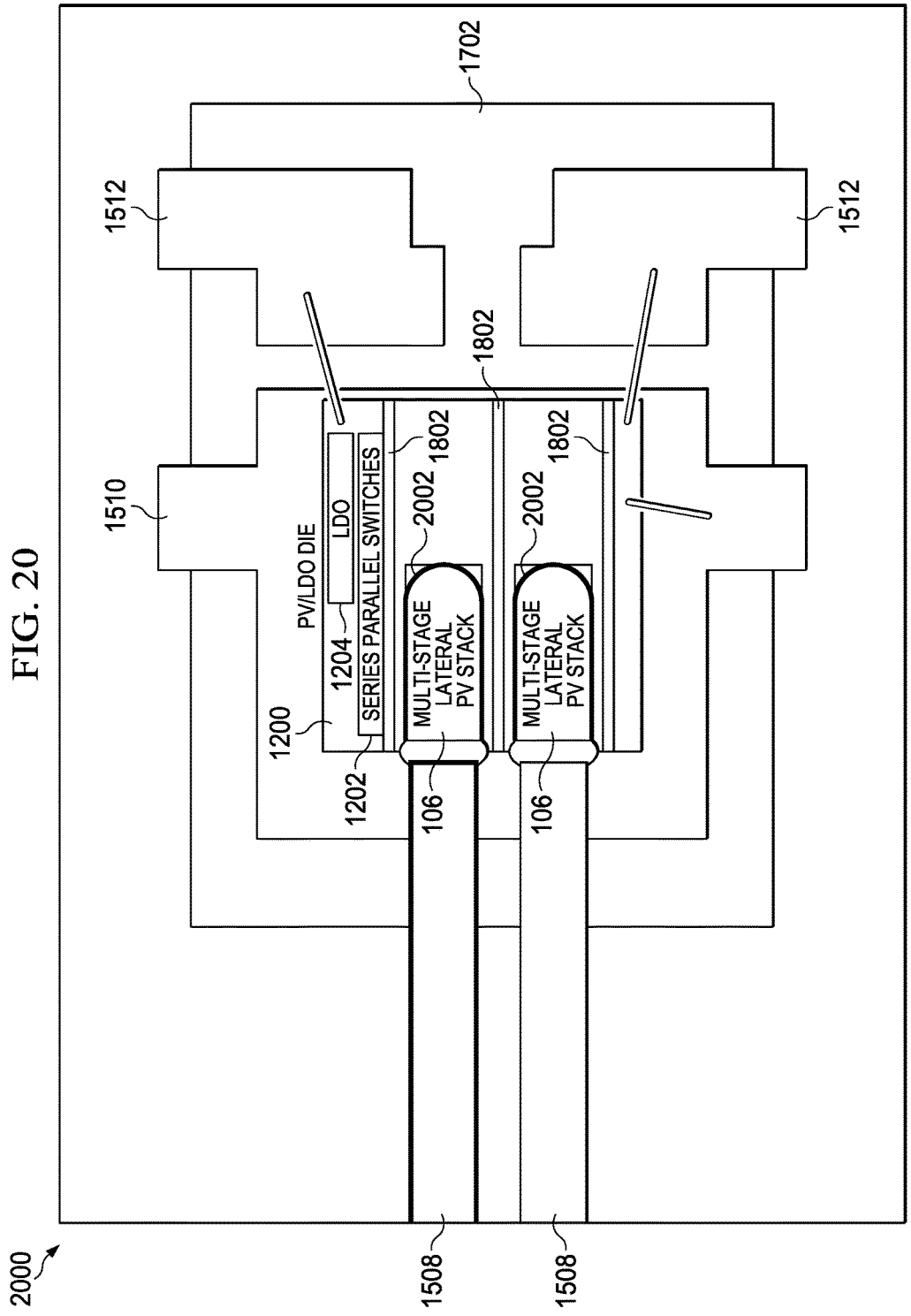
FIG. 20 is a partial schematic top plan view of an example LDO regulator with multiple LMSPV light sensor channels separated by a black polymer barrier and individually including curved trenches filled with reflective material around the LMSPV light sensor channels.

Referring now to FIGS. 19 and 20, the optical isolation technique and the barrier structure 1802 of FIG. 18 can be used in other embodiments in which it is desirable to optically isolate different channels or different circuits. FIG. 19 shows another regulator system 1900 including multiple optical channels. Each channel in this example includes an LMSPV stack structure 106 that receives a light signal through a corresponding optical fiber or ribbon 1508. Black polymer-filled trench isolation structures 1802 are formed in this example along the upper and lower edges of each of the LMSPV sensor structures 106. This effectively prevents optical cross talk between the LMSPV sections or cells 106, and also prevents optical interference with the switching circuit 1202 and/or the LDO regulator circuitry 1204 formed in the device 1200.

FIG. 20 shows a further example including the black polymer-filled optical isolation structures 1802 described above to confine optical signals within the two illustrated LMSPV portions 106. In this example, a reflective material-filled structure 2002 is formed around the LMSPV portions 106 of each of the optical channels. As previously discussed, the use of reflective materials enhances the capture efficiency of the LMSPV structure 106 by facilitating further opportunity for photon capture within the semiconductor material and the extended p-n junction. In one implementation, the reflector structures 2002 include straight portions throughout most of the length of the LMSPV structures 106, and the backsides of the LMSPV structures include arcuate portions, such as parabola shaped portions. In one example, the structures 2002 are formed by a selective deep etch process similar to that used in forming the optical isolation structures 1802. A deep trench is formed in the semiconductor structures after fabrication of the LMSPV components 106, and the trenches are filled with optically reflective material, such as glass. The die is then back-ground to expose the glass, leaving an enhanced LMSPV structure 106 with a reflective structure 2002 laterally surrounding three sides of the semiconductor structure and the extended p-n junction thereof. Between the adjacent optical channels, moreover, the black polymer-filled structures 1802 provide optical isolation to mitigate or avoid optical cross talk between the optical channels. As previously discussed, moreover, reflective material can be added to the top and bottom of the individual LMSPV structures 106, for example, reflective epoxy on the bottom B and an oxide layer or material formed on the top side T (e.g., 109 in FIG. 1).

Figure 21:
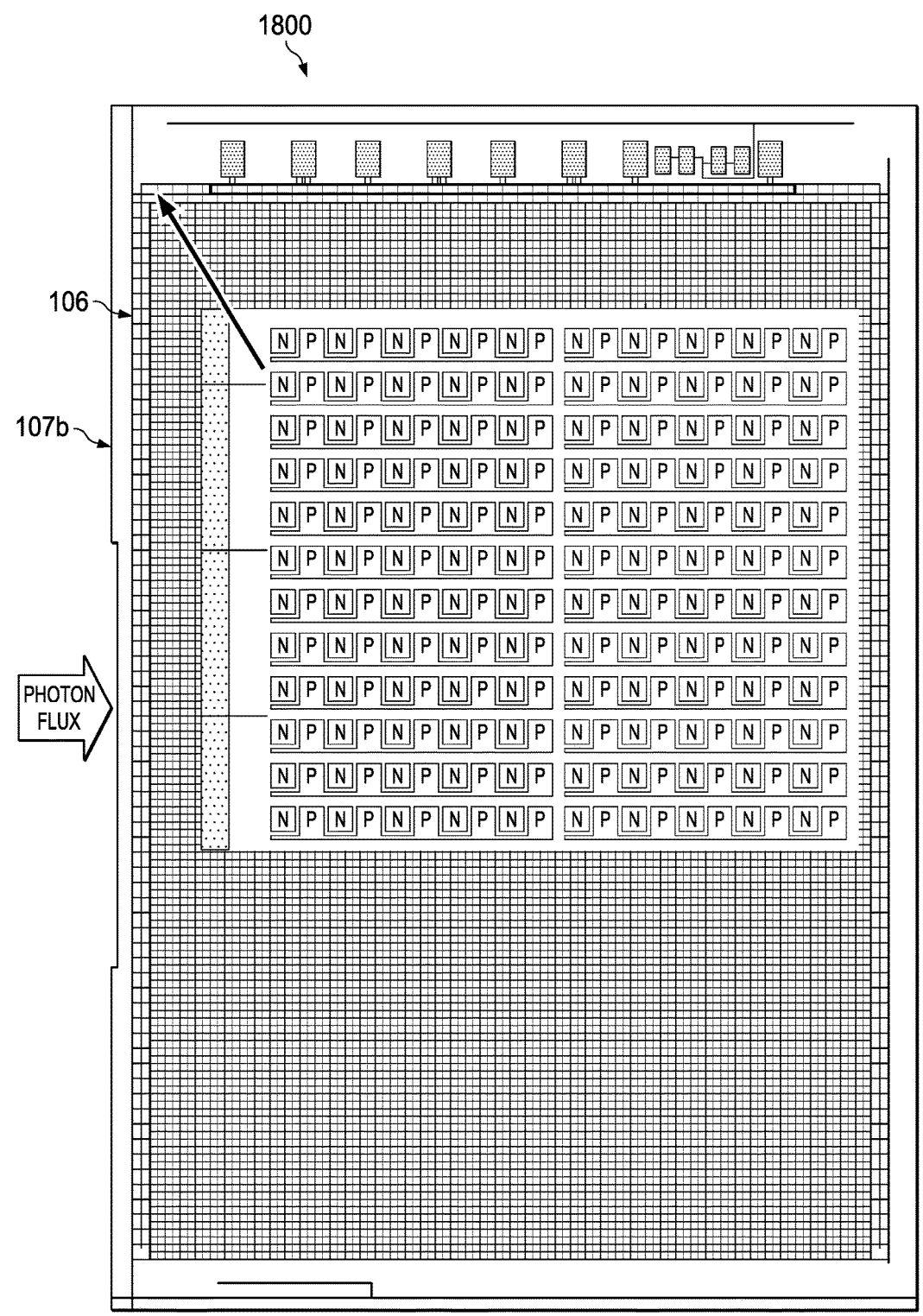
FIG. 21 is a partial schematic top plan view of an example LMSPV light sensor semiconductor structure showing further details of several example interconnected semiconductor structures individually including multiple n-doped regions in a p-doped region to form multiple laterally spaced p-n junctions.
Figure 22:
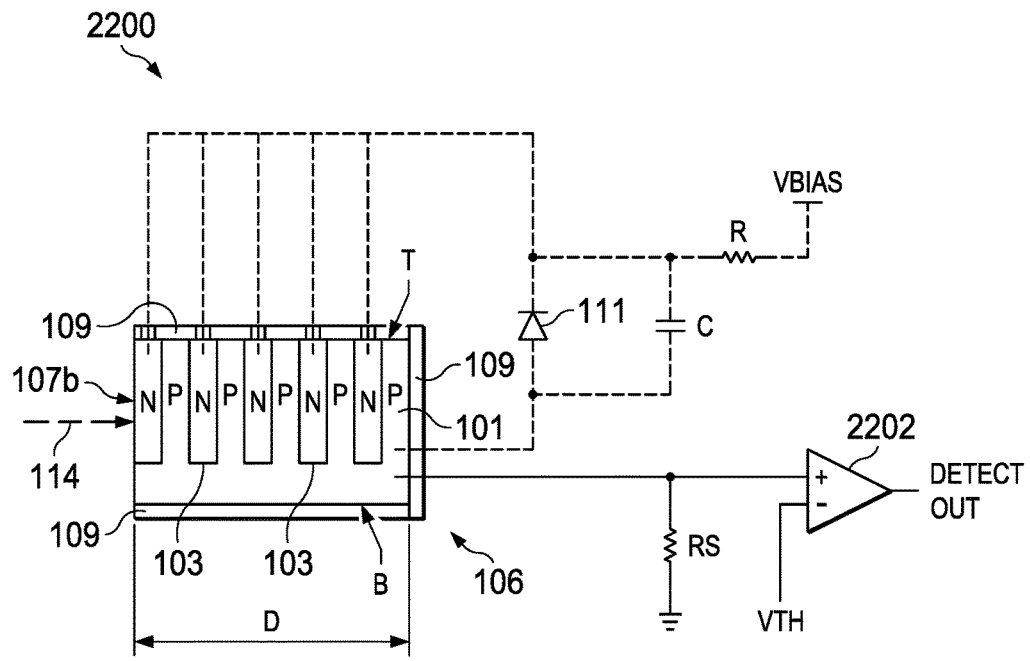
FIG. 22 is a partial schematic diagram of an example photon sensor including a lateral light sensor semiconductor structure with a multiple p-n junctions disposed along an extended effective junction distance, and a quench circuit to provide a photon multiplier circuit.
Figure 23:
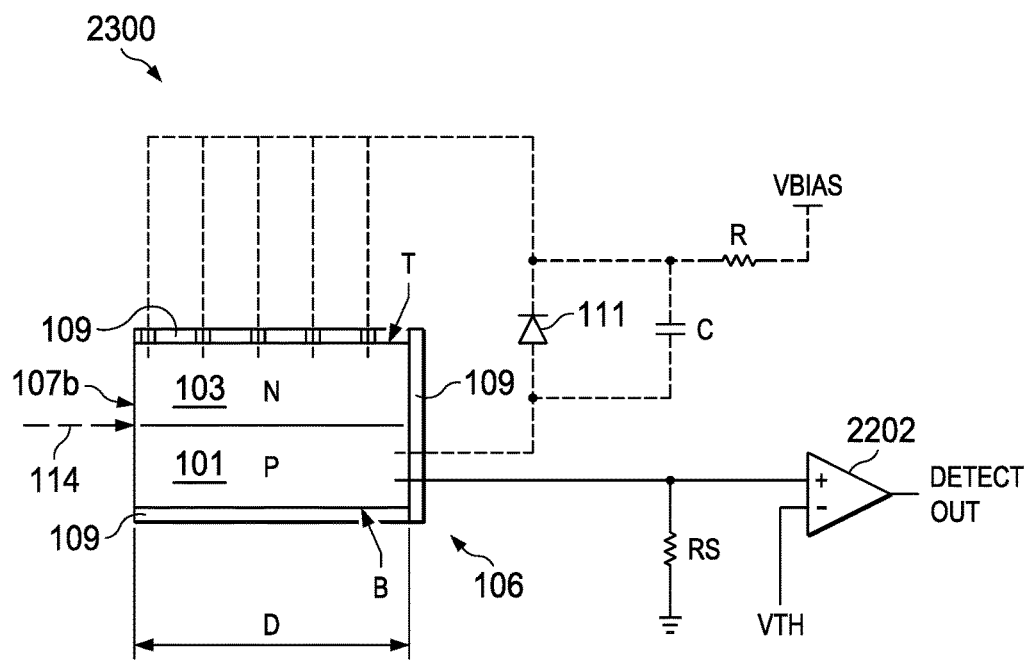
FIG. 23 is a partial schematic diagram of another example photon sensor including a lateral light sensor semiconductor structure with a single p-n junction disposed along an extended effective junction distance, and a quench circuit to provide a photon multiplier circuit.

Referring now to FIGS. 21-23, a unique construction of a Silicon photo multiplier device (SiPMD) is shown. The present disclosure provides SiPMDs which are not used in the conventional manner with photons entering the top surface of the silicon array. Instead, like the example devices described above, the SiPMD devices have photons entering at the side or edge into an extended collection distance. The SiPMD multiplies a single input photon into an avalanche of electrons in the PN cell of the array where the electron-hole pair is generated. In the example of FIG. 21, each array cell is isolated from the next cell so the avalanche does not propagate across the entire structure. The avalanche occurs because the cell is operated near its avalanche breakdown, so that one photon is enough to cause avalanche current flow. This creates high gain amplification in each cell making this a sensitive detector. Once tripped into avalanche, the cell needs to be reset, so there is a series quenching resistor R for each cell as shown in FIGS. 22 and 23. The quench circuit resistor R allows the cell voltage to drop enough to allow it to exit from avalanche. All these cells and quench resistors are in parallel, so the combined output current is representative of photon density times a very large gain factor, and the circuit uses a bias to operate. Moreover, the lateral construction enhances the sensitivity of the detector.

FIG. 21 illustrates an example LMSPV array structure 2100 including multiple light sensor semiconductor structures formed in an array. The LMSPV structure 2100 includes a lateral sensor face 107*b* and a matrix or array of a large number of individual P-N cells having an extended affective junction distance D as described above. In this example, the individual cells of the array includes a single n-doped portion 103 formed in an isolated p-doped region 101 to create an array of individual of p-n junctions disposed substantially throughout the extended affective junction distance D. FIG. 21 further illustrates a breakout view of a portion of two columns and several rows of the array cells in one example. In addition, as described below in connection with FIGS. 22 and 23, the LMSPV structure 2100 can also be employed in photon sensor applications.

As schematically shown in FIGS. 22 and 23, the LMSPV structures 106 can be employed in photon sensing systems and circuits, whether an array with multiple cells or a single semiconductor structure 106 having a p-doped portion 101 and one or more n-doped portions 103 to form an extended junction. FIG. 22 shows an example photon detector circuit 2200 with a semiconductor structure 101, 103 including multiple n-doped portions 103 disposed within a p-doped portion 101 as described above. The structure forms an extended junction light sensor 106 with a lateral sensor face 107*b* to receive photons along an optical path 114, where the sensor structure 106 has an effective junction distance D that is a constant K times the absorption depth for the semiconductor structure corresponding to a given wavelength λ of the incoming light signal. A circuit 2300 in FIG. 23 shows a similar arrangement using an extended junction light sensor circuit 106 having a single n-doped portion 103. The light sensors in the detector circuits 2200 and 2300 in FIGS.

22 and 23 include an equivalent parasitic capacitor, diode and resistor in each diode cell of the array that form a quenching circuit with a capacitor C coupled in parallel with the sensor circuit diode 111 between the p-doped portion 101 and the n-doped portions 103, as well as a resistor R coupled between a bias voltage VBIAS and the n-doped portions 103. The resulting structure forms a quench circuit to detect a small number of photons, or even reception of a single photon in the lateral sensor structure 106. In operation, the application of a bias voltage to the resistor R charges the capacitor C while the sensor circuit diode 111 is reverse biased. The bias voltage VBIAS is set to a level corresponding to the specifics of the sensor circuit diode 111 in order to charge the capacitor C (while the diode 111 does not conduct) to a level just below the avalanche rating of the diode 111. With the parasitic capacitor C charged, the circuit 2200 is ready to receive one or more photons along the optical path 114 at the sensor face 107b. Successful capture of an incident photon in the sensor structure 106 causes the p-n junction to conduct an avalanche current to discharge the parasitic capacitor C. Once the parasitic capacitor C discharges to a level below the avalanche threshold of the diode 111, the diode 111 discontinues conduction, and the parasitic resistor R again charges the capacitor C. The discharge/charge of the parasitic capacitor C creates a signal representing capture of the photon by the detector circuit 2200, 2300. A current sense threshold comparison can be used to create a detector output signal based on this increased current flow. A sense resistor RS is connected from the +input of comparator 2202 to a circuit ground reference to establish a voltage signal in response to the received current spike. In FIGS. 22 and 23, the p-doped portion 101 is connected to a non-inverting (+) input of a voltage comparator 2202 to receive the signal voltage. The comparator 2202 compares the signal voltage with a threshold voltage VTH to generate a detector output signal DETECT OUT in response to the current spike. As the current signal generated by discharge/charge of the capacitor C is much greater than the carrier current generated in the sensor structure 106 by creation of an electron/hole pair, the circuitry 2200, 2300 provides a photon multiplier circuit which can be employed in photon detection or other useful applications. Because the detector array can detect individual photons, it is also possible to use a low efficiency emitter for the photon source. This allows use of standard silicon with a forward biased silicon PN junctions emitter for low intensity IR radiation instead of a GaAs LED. Reverse biased avalanche or zener junctions can also be used to emit low intensity visible light.

Disclosed examples a high efficiency lateral PV cell with lateral photon entry into an extended-length effective p-n junction. In certain examples, the effective lateral junction distance D is set to a multiple of the absorption depth of a photon of a given wavelength λ to facilitate high collection efficiency. This greatly enhances the opportunity for electron/hole pair generation in the semiconductor structure of the light sensor 106. The disclosed examples provide advantages in low-power signal transfer across an optical channel, and enable high efficiency optical transfer of power across a galvanic isolation barrier. In addition, the disclosed concepts find utility in photon detectors or photon multipliers. In certain configurations, a large number of sensor cells 106 are interconnected for higher levels of power delivery, and each cell is a low-cost construction. Low-cost stacked configurations are possible where the individual photovoltaic cells 106 can include optically reflective materials 109 on the top T, bottom B, the backside and lateral sides via oxide and/or reflective epoxy, with a negative (N-type) node connected by one or more bondpads on the top T and a positive (P-type) in the semiconductor material on the bottom B. This example construction enables simple die stacking with conductive epoxy to interconnect the resulting photosensitive diodes in any desired fashion. Disclosed examples provide potentially large efficiency improvements for photon-to-electrical power transfer relative to conventional optical isolation techniques and devices. Moreover, the lateral photon transfer easily adapts to different isolation voltage ratings by controlling the spacing between the light source 108 and the light sensor 106, with the ability to provide any suitable optical transmission medium (e.g., glass, air, polymer) and extremely large voltage separation ratings can be achieved by separating the source and sensor by large distances using optical fibers or optical ribbons.

The above examples are merely illustrative of several possible embodiments of various aspects of the present disclosure, wherein equivalent alterations and/or modifications will occur to others skilled in the art upon reading and understanding this specification and the annexed drawings. Modifications are possible in the described embodiments, and other embodiments are possible, within the scope of the claims.

The following is claimed:

1. An isolation circuit, comprising:
   a light source configured to generate a light signal of a given wavelength along an optical path; and
   a light sensor spaced by an optical channel distance from the light source, the light sensor comprising:
   a semiconductor structure, including:
      a top,
      a bottom,
      a front side at least partially facing the optical path to provide a sensor face to receive the light signal,
      a back side spaced from the front side,
      a plurality of lateral sides extending vertically between the top and the bottom, the lateral sides extending horizontally between the front side and the back side,
      a p-doped portion including p-type dopants, and
      an n-doped portion including n-type dopants at least partially adjacent to the p-doped portion to form at least one p-n junction extending between the front side and the back side by an effective junction distance, the effective junction distance being greater than a constant K times an absorption depth for the semiconductor structure that corresponds to the given wavelength, K being greater than or equal to 5.

2. The isolation circuit of claim 1, wherein the semiconductor structure further includes a reflective material on at least one of the top, the bottom, the backside, and the lateral sides.

3. The isolation circuit of claim 1, wherein K is greater than or equal to 10.

4. The isolation circuit of claim 1, wherein K is greater than or equal to 20.

5. The isolation circuit of claim 1, wherein the semiconductor structure includes silicon.

6. The isolation circuit of claim 1, wherein the light sensor comprises a plurality of vertically stacked semiconductor structures, each semiconductor structure including:
   a top;
   a bottom;
   a front side at least partially facing the optical path to provide a sensor face to receive the light signal;

a back side spaced from the front side;
a plurality of lateral sides extending vertically between the top and the bottom, the lateral sides extending horizontally between the front side and the back side;
a p-doped portion including p-type dopants, the p-doped portion extending along at least a portion of the bottom; and
an n-doped portion including n-type dopants at least partially adjacent to the p-doped portion to form at least one p-n junction extending between the front side and the back side by the effective junction distance.

7. The isolation circuit of claim 6, wherein each semiconductor structure further includes a reflective material on at least one of the top, the bottom, the backside, and the lateral sides.

8. The isolation circuit of claim 6, further comprising a switching circuit to electrically interconnect the p-n junctions of the plurality of semiconductor structures.

9. The isolation circuit of claim 1, comprising a regulator circuit to provide a power supply signal based on an electrical signal from the light sensor.

10. The isolation circuit of claim 1, further comprising:
a leadframe structure, including a plurality of electrical conductors, the light source being electrically coupled with a first pair of the electrical conductors of the leadframe structure, and the light sensor being electrically coupled with a second pair of the electrical conductors of the leadframe structure; and
a molded package structure enclosing the light source, the light sensor and portions of the leadframe structure, the molded package structure exposing portions of the first and second pairs of the electrical conductors to allow external connection to the light source and the light sensor.

11. The isolation circuit of claim 10, further comprising an optical transmission medium disposed along the optical path between the light source and the light sensor.

12. An isolation circuit, comprising:
a light source configured to generate a light signal of a given wavelength along an optical path; and
a light sensor spaced by an optical channel distance from the light source, the light sensor comprising:
a semiconductor structure, including:
a top,
a bottom,
a front side at least partially facing the optical path to provide a sensor face to receive the light signal,
a back side spaced from the front side,
a plurality of lateral sides extending vertically between the top and the bottom, the lateral sides extending horizontally between the front side and the back side,
a p-doped portion including p-type dopants, the p-doped portion extending along at least a portion of the bottom,
an n-doped portion including n-type dopants at least partially adjacent to the p-doped portion to form at least one p-n junction extending between the front side and the back side by an effective junction distance, the n-doped portion extending along at least a portion of the top, the effective junction distance being greater than a constant K times an absorption depth for the semiconductor structure that corresponds to the given wavelength, K being greater than or equal to 5,
a capacitor coupled between the p-doped portion and the n-doped portion, and
charge the capacitor to a voltage to bias the p-n junction near an avalanche voltage to allow capture of a photon by the p-n junction to cause the p-n junction to conduct an avalanche current to discharge the capacitor to generate a signal representing capture of the photon.

13. An optical sensor circuit to sense a light signal of a given wavelength along an optical path, comprising:
a semiconductor structure, including a top, a bottom, a front side at least partially facing the optical path, a back side spaced from the front side, and a plurality of lateral sides extending vertically between the top and the bottom, the lateral sides extending horizontally between the front side and the back side; and
a p-n junction formed in the semiconductor structure, the p-n junction extending between the front side and the back side by an effective junction distance greater than a constant K times an absorption depth for the semiconductor structure that corresponds to the given wavelength, K being greater than or equal to 5.

14. The optical sensor circuit of claim 13, wherein the p-n junction includes:
a p-doped portion including p-type dopants, the p-doped portion extending along at least a portion of the bottom; and
an n-doped portion including n-type dopants extending along at least a portion of the top at least partially adjacent to the p-doped portion to form the p-n junction.

15. The optical sensor circuit of claim 13, comprising a regulator circuit to provide a power supply signal based on an electrical signal from the p-n junction.

16. An optical sensor circuit to sense a light signal of a given wavelength along an optical path, comprising:
a semiconductor structure, including a top, a bottom, a front side at least partially facing the optical path, a back side spaced from the front side, and a plurality of lateral sides extending vertically between the top and the bottom, the lateral sides extending horizontally between the front side and the back side;
a p-n junction formed in the semiconductor structure, the p-n junction extending between the front side and the back side by an effective junction distance greater than a constant K times an absorption depth for the semiconductor structure that corresponds to the given wavelength, K being greater than or equal to 5;
a capacitor coupled between a p-doped portion of the p-n junction and an n-doped portion of the p-n junction; and
a resistor coupled between a bias voltage and the n-doped portion to charge the capacitor to a voltage to bias the p-n junction near an avalanche voltage to allow capture of a photon by the p-n junction to cause the p-n junction to conduct an avalanche current to discharge the capacitor to generate a signal representing capture of the photon.

17. A lateral multi-stage photovoltaic sensor system, comprising:
a plurality of vertically stacked silicon structures, individually including a top, a bottom, a front side to provide a sensor face to receive photons of a given wavelength, a back side spaced from the front side, a plurality of lateral sides extending vertically between the top and the bottom, and a junction region extending between the front side and the back side by an effective junction distance greater than a constant K times an absorption depth for silicon that corresponds to the given wavelength, K being greater than or equal to 5, the junction region including a p-doped portion in the silicon structure and a plurality of n-doped portions formed in the p-doped portion to provide a plurality of p-n junctions throughout substantially the entire effective junction distance between the front side and the back side; and a circuit to electrically interconnect the p-n junctions of the plurality of vertically stacked semiconductor structures to provide an electrical signal indicating capture of the photons at or near the p-n junctions.

18. The isolation circuit of claim 12, wherein the light sensor comprises a plurality of vertically stacked semiconductor structures, each semiconductor structure including:

a top;
a bottom;
a front side at least partially facing the optical path to provide a sensor face to receive the light signal;
a back side spaced from the front side;
a plurality of lateral sides extending vertically between the top and the bottom, the lateral sides extending horizontally between the front side and the back side;
a p-doped portion including p-type dopants, the p-doped portion extending along at least a portion of the bottom; and
an n-doped portion including n-type dopants at least partially adjacent to the p-doped portion to form at least one p-n junction extending between the front side and the back side by the effective junction distance.

19. The optical sensor circuit of claim 16, wherein the p-n junction includes:

a p-doped portion including p-type dopants, the p-doped portion extending along at least a portion of the bottom; and
an n-doped portion including n-type dopants extending along at least a portion of the top at least partially adjacent to the p-doped portion to form the p-n junction.

* * * * *